United States Patent
Leggett et al.

(10) Patent No.: US 10,162,343 B2
(45) Date of Patent: Dec. 25, 2018

(54) ADAPTIVE PROCESSES FOR IMPROVING INTEGRITY OF SURFACES

(71) Applicant: Apple Inc., Cupertino, CA (US)

(72) Inventors: William F. Leggett, San Francisco, CA (US); Simon Regis Louis Lancaster-Larocque, Gloucester (CA)

(73) Assignee: Apple Inc., Cupertino, CA (US)

( * ) Notice: Subject to any disclaimer, the term of this patent is extended or adjusted under 35 U.S.C. 154(b) by 482 days.

(21) Appl. No.: 14/339,125

(22) Filed: Jul. 23, 2014

(65) Prior Publication Data
US 2016/0026176 A1   Jan. 28, 2016

Related U.S. Application Data

(63) Continuation of application No. PCT/US2014/047763, filed on Jul. 23, 2014.

(51) Int. Cl.
| | |
|---|---|
| *G06F 19/00* | (2018.01) |
| *G05B 19/418* | (2006.01) |
| *H05K 13/00* | (2006.01) |
| *G06F 1/16* | (2006.01) |

(52) U.S. Cl.
CPC ..... *G05B 19/41875* (2013.01); *G06F 1/1613* (2013.01); *H05K 13/00* (2013.01); *Y02P 90/04* (2015.11)

(58) Field of Classification Search
CPC .......... G05B 19/41875; H05K 13/0023; G06F 1/1613; Y02P 90/02; Y02P 90/04
See application file for complete search history.

(56) References Cited

U.S. PATENT DOCUMENTS

| | | | |
|---|---|---|---|
| 3,554,122 A | 1/1971 | Priesmeyer et al. | |
| 4,569,092 A | 2/1986 | Baus | |
| 5,128,829 A | 7/1992 | Loew | |
| 5,317,792 A | 6/1994 | Tanaka | |
| 5,382,317 A * | 1/1995 | Thomas | B05D 1/42 216/23 |
| 5,509,915 A | 4/1996 | Hanson et al. | |
| 5,776,605 A | 7/1998 | May | |

(Continued)

FOREIGN PATENT DOCUMENTS

| | | |
|---|---|---|
| EP | 0700515 B1 | 9/2000 |
| WO | 2012103933 A1 | 8/2012 |

OTHER PUBLICATIONS

PCT/US2014/047763 International Search Report & Written Opinion dated Mar. 25, 2015.

*Primary Examiner* — Michael D Masinick
(74) *Attorney, Agent, or Firm* — Dickinson Wright RLLP

(57) ABSTRACT

A process for performing localized corrective actions to structure of an electronic device is described. The structure may include a mating surface configured to receive another structure such that the two structures may be, for example, adhesively bonded together. The localized corrective actions are configured not to improve the mating surface but to also prevent light within the electronic device from escaping in undesired areas of the electronic device. In some embodiments, the corrective action includes using a removal tool to remove identified portions of the surface. In other embodiments, the corrective action includes using a different tool to add material identified portions of the surface. The identified means may include an automated inspection system.

20 Claims, 16 Drawing Sheets

(56) References Cited

U.S. PATENT DOCUMENTS

| | | |
|---|---|---|
| 5,856,699 A | 1/1999 | Hayashi et al. |
| 6,040,846 A | 3/2000 | Stanton et al. |
| 6,280,349 B1 | 8/2001 | Cook |
| 6,501,554 B1 | 12/2002 | Hackney et al. |
| 6,579,095 B2 | 6/2003 | Marshall et al. |
| 6,592,040 B2 | 7/2003 | Barkan et al. |
| 6,612,686 B2 | 9/2003 | Mutz et al. |
| 6,621,173 B1 | 9/2003 | Yamakawa et al. |
| 6,624,225 B1 | 9/2003 | Ellison et al. |
| 6,775,130 B2 | 8/2004 | Cronk |
| 6,812,976 B2 | 11/2004 | Satonaka |
| 6,828,069 B1 | 12/2004 | Nakazawa et al. |
| 6,985,239 B2 | 1/2006 | Doucet et al. |
| 6,995,334 B1 | 2/2006 | Kovacevic |
| 7,035,110 B1 | 4/2006 | Wang et al. |
| 7,035,761 B2 | 4/2006 | Link et al. |
| 7,203,355 B2 | 4/2007 | Levi et al. |
| 7,373,852 B2 | 5/2008 | Boge et al. |
| 7,423,225 B1 | 9/2008 | Kroll et al. |
| 7,503,110 B2 | 3/2009 | Domitrovits et al. |
| 7,933,123 B2 | 4/2011 | Wang et al. |
| 8,007,348 B2 | 8/2011 | Baratta |
| 8,029,927 B2 | 10/2011 | Tucholski |
| 8,175,734 B2 | 5/2012 | Fogel et al. |
| 8,203,083 B2 | 6/2012 | Song |
| 8,236,400 B2 | 8/2012 | Trigg et al. |
| 8,322,267 B2 | 12/2012 | Altergott et al. |
| 8,372,502 B2 | 2/2013 | Hill et al. |
| 8,395,893 B2 | 3/2013 | Harmon et al. |
| 8,427,817 B2 | 4/2013 | Lewis et al. |
| 8,525,046 B2 | 9/2013 | Sugai |
| 8,536,889 B2 | 9/2013 | Nelson et al. |
| 8,614,118 B2 | 12/2013 | Haji et al. |
| 8,621,819 B2 | 1/2014 | Kayani et al. |
| 8,828,163 B2 | 9/2014 | Hill |
| 8,849,437 B2 | 9/2014 | Chow et al. |
| 8,937,689 B2 | 1/2015 | Prest et al. |
| 9,016,642 B1 | 4/2015 | Ay et al. |
| 9,081,428 B2 | 7/2015 | Liu |
| 9,096,026 B2 | 8/2015 | Hall et al. |
| 9,096,372 B2 | 8/2015 | Vulpitta |
| 9,158,151 B2 | 10/2015 | Ogata et al. |
| 9,250,651 B2 | 2/2016 | Cavallaro et al. |
| 9,265,294 B2 | 2/2016 | Ellis et al. |
| 9,308,710 B2 | 4/2016 | Ko |
| 9,343,797 B2 | 5/2016 | Shoemaker et al. |
| 9,360,643 B2 | 6/2016 | Rinzler et al. |
| 9,456,131 B2 | 9/2016 | Tran |
| 9,462,093 B2 | 10/2016 | Hegemier et al. |
| 9,467,541 B2 | 10/2016 | Tanaka |
| 9,483,078 B2 | 11/2016 | Song et al. |
| 9,494,132 B2 | 11/2016 | Riddell et al. |
| 9,510,492 B2 | 11/2016 | Liu et al. |
| 9,521,498 B2 | 12/2016 | Xu et al. |
| 9,527,241 B2 | 12/2016 | Levine et al. |
| 9,532,660 B2 | 1/2017 | Jafa et al. |
| 9,545,638 B2 | 1/2017 | Spiryagin et al. |
| 9,579,844 B2 | 2/2017 | Schmid et al. |
| 9,603,752 B2 | 3/2017 | Brown et al. |
| 9,669,492 B2 | 6/2017 | Linyaev et al. |
| 9,767,993 B2 | 9/2017 | Ishibashi et al. |
| 9,788,674 B2 | 10/2017 | Pacione et al. |
| 9,810,923 B2 | 11/2017 | Stevens et al. |
| 9,850,411 B2 | 12/2017 | Goubard |
| 9,864,403 B2 | 1/2018 | Franklin et al. |
| 9,865,176 B2 | 1/2018 | Tran |
| 9,879,157 B2 | 1/2018 | Sherman et al. |
| 2001/0032698 A1 | 10/2001 | Bottari |
| 2002/0009221 A1 | 1/2002 | Hercke et al. |
| 2003/0037448 A1 | 2/2003 | Saksa |
| 2004/0055699 A1 | 3/2004 | Smith et al. |
| 2004/0074045 A1 | 4/2004 | Winstead et al. |
| 2004/0182707 A1 | 9/2004 | Jardemark et al. |
| 2005/0001036 A1 | 1/2005 | Blake et al. |
| 2005/0002016 A1 | 1/2005 | Tsao |
| 2005/0094362 A1 | 5/2005 | Stephens |
| 2005/0111301 A1 | 5/2005 | Rickman |
| 2005/0128695 A1 | 6/2005 | Han |
| 2005/0135874 A1 | 6/2005 | Baylis et al. |
| 2005/0166737 A1 | 8/2005 | Caluori |
| 2005/0186540 A1 | 8/2005 | Taub et al. |
| 2006/0019088 A1 | 1/2006 | Wang et al. |
| 2006/0157697 A1 | 7/2006 | Nagano |
| 2007/0015111 A1 | 1/2007 | Kopelman et al. |
| 2007/0047109 A1 | 3/2007 | Shibata et al. |
| 2007/0087457 A1 | 4/2007 | Tseng et al. |
| 2007/0181456 A1 | 8/2007 | Kusuda et al. |
| 2007/0185243 A1 | 8/2007 | Terada et al. |
| 2007/0259988 A1 | 11/2007 | Dorsman et al. |
| 2007/0291804 A1 | 12/2007 | Day et al. |
| 2008/0055258 A1 | 3/2008 | Sauers |
| 2008/0063218 A1 | 3/2008 | Weber et al. |
| 2009/0067125 A1 | 3/2009 | Xia et al. |
| 2009/0133941 A1 | 5/2009 | Endo |
| 2009/0186552 A1* | 7/2009 | Shinya ............. G02F 1/133502 445/58 |
| 2010/0041449 A1 | 2/2010 | Nakao et al. |
| 2010/0113896 A1 | 5/2010 | Cadio et al. |
| 2010/0123089 A1 | 5/2010 | Chen |
| 2010/0210745 A1 | 8/2010 | McDaniel et al. |
| 2010/0219542 A1 | 9/2010 | Tsujikawa et al. |
| 2010/0270052 A1 | 10/2010 | Crohas et al. |
| 2010/0328854 A1 | 12/2010 | Nakao et al. |
| 2011/0050053 A1 | 3/2011 | Deng |
| 2011/0114839 A1 | 5/2011 | Stecker et al. |
| 2011/0192708 A1 | 8/2011 | Taniguchi |
| 2011/0221626 A1 | 9/2011 | Hill |
| 2012/0026163 A1 | 2/2012 | Koyama et al. |
| 2012/0050975 A1 | 3/2012 | Garelli et al. |
| 2012/0088208 A1 | 4/2012 | Schulter et al. |
| 2012/0156501 A1 | 6/2012 | Campbell |
| 2012/0165682 A1 | 6/2012 | Keeney et al. |
| 2012/0218732 A1 | 8/2012 | Minemura et al. |
| 2012/0242580 A1 | 9/2012 | Yamamoto |
| 2012/0298929 A1 | 11/2012 | Mizumura et al. |
| 2013/0110469 A1 | 5/2013 | Kopelman |
| 2013/0201660 A1 | 8/2013 | Barbier |
| 2013/0215638 A1 | 8/2013 | Dabov et al. |
| 2013/0336814 A1 | 12/2013 | Kamen et al. |
| 2014/0035995 A1 | 2/2014 | Chou et al. |
| 2014/0055600 A1 | 2/2014 | Ong et al. |
| 2014/0083731 A1 | 3/2014 | Chow et al. |
| 2014/0169607 A1 | 6/2014 | Goida et al. |
| 2014/0234530 A1* | 8/2014 | Frankenberger .......... B64C 1/00 427/8 |
| 2014/0240615 A1* | 8/2014 | Allore ............... B29C 45/14311 349/12 |
| 2014/0240911 A1 | 8/2014 | Cole et al. |
| 2014/0328036 A1 | 11/2014 | Sarraf et al. |
| 2014/0358273 A1* | 12/2014 | LaBossiere ......... B29C 67/0051 700/119 |
| 2015/0004382 A1 | 1/2015 | Menon et al. |
| 2015/0027000 A1 | 1/2015 | Barnes et al. |
| 2015/0051358 A1 | 2/2015 | Bunnelle et al. |
| 2015/0111623 A1 | 4/2015 | Hegemier et al. |
| 2015/0125596 A1 | 5/2015 | Ramakrishnan et al. |
| 2015/0197062 A1* | 7/2015 | Shinar ................. B29C 67/0088 700/98 |
| 2015/0210076 A1 | 7/2015 | Rivas et al. |
| 2015/0282330 A1 | 10/2015 | Iseda et al. |
| 2015/0295344 A1 | 10/2015 | Sawada et al. |
| 2015/0341478 A1 | 11/2015 | Bonar et al. |
| 2016/0029496 A1 | 1/2016 | Leggett et al. |
| 2016/0054761 A1 | 2/2016 | Wolff et al. |
| 2016/0150305 A1 | 5/2016 | Wan et al. |
| 2017/0223846 A1 | 8/2017 | Elolampi et al. |
| 2017/0268495 A1 | 9/2017 | Overson et al. |
| 2017/0290533 A1 | 10/2017 | Antonio et al. |
| 2017/0345536 A1 | 11/2017 | Breiwa et al. |
| 2017/0350878 A1 | 12/2017 | Holmes et al. |

\* cited by examiner

ADAPTIVE PROCESSES FOR IMPROVING INTEGRITY OF SURFACES

CROSS-REFERENCE TO RELATED APPLICATION(S)

This application is a continuation of International Application PCT/US14/47763, with an international filing date of Jul. 23, 2014, entitled "ADAPTIVE PROCESSES FOR IMPROVING INTEGRITY OF SURFACES", which is incorporated herein by reference in its entirety.

FIELD

The described embodiments relate generally to manufacturing an electronic device. In particular, the present embodiments relate to providing a corrective action or step to a device during manufacturing or assembly of the electronic device.

BACKGROUND

Recent advances in manufacturing an electronic device allow for improved production times. This leads to additional electronic devices produced per time. During assembly, some parts of the electronic device provide a mounting surface for other structures. These surfaces are considered "critical" in that they must be manufactured within a specified tolerance in order for another structure to properly mount on the surface of the part.

However, when the surface is not within the specified tolerance, several issues may occur. For example, a part having mounting surfaces with disturbances (e.g., protrusions, bumps, burrs) left after machining the part may lead to an adhesive layer unable to flow or extend along the mounting surface in a desired manner which may cause the part to be improperly attached to the mounting surface. One issues associated with this is a display not properly attaching to a mounting surface of a lid (enclosure). When this occurs, light from light source (e.g., LED, display) may "leak," that is, light may pass through unwanted or unintended portions of the electronic device. Light leakage passing through a top portion of the device is generally viewed as undesirable by a user, as well as an inefficient use of a light source. In order to prevent the user from using the device, the device may be discarded after a valuable component (e.g., display) has been installed, thereby increasing yield fallout of the electronic device.

Another issue associated with mounting surfaces out of tolerance is a hinge assembly on, for example, a portable electronic device. A hinge assembly on an uneven surface affects the kinematics of the electronic device. For example, a lid may not properly open and close with respect to a base portion.

SUMMARY

In one aspect, a method for providing a corrective action to an enclosure of an electronic device is described. The method may include scanning the enclosure with an automated inspection system, the automated inspection system capable of locating a dimension of the enclosure. In some embodiments, the dimension may not within a predetermined tolerance of the enclosure. The method may further include forming a comparison between the dimension and the predetermined tolerance. The method may further include sending the comparison to a tool. In some embodiments, the comparison may signal a tool to perform the corrective action to the dimension based on the comparison. Also, in some embodiments, performing the corrective action to the dimension causes the dimension to be least within the predetermined tolerance.

In another aspect, a method for assembling an electronic device is described. The method may include performing a first adjustment to a first surface of a first component. The first adjustment may remove a protrusion of the first surface. The method may further include performing a second adjustment to a second surface of the first component. The second adjustment may add a material to the second surface such that the second surface is approximately even, or level. The method may further include attaching a second component to the first surface of the first component. The method may further include attaching a third component to the second surface of the first component. In some embodiments, the first adjustment and the second adjustment are located by an automated inspection system.

In another aspect, a non-transitory computer readable storage medium storing instructions that, when executed by a processor, cause the processor to implement a method for providing a corrective action to an enclosure of an electronic device is described. The non-transitory computer readable storage medium may include computer code for scanning the enclosure with an automated inspection system, the automated inspection system capable of locating a dimension of the enclosure. In some embodiments, the dimension may not within a predetermined tolerance of the enclosure. The non-transitory computer readable storage medium may also further include computer code for forming a comparison between the dimension and the predetermined tolerance. The non-transitory computer readable storage medium may further include computer code sending the comparison to a tool. In some embodiments, the comparison may signal a tool to perform the corrective action to the dimension based on the comparison. Also, in some embodiments, the computer code performing the corrective action to the dimension causes the dimension to be least within the predetermined tolerance.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
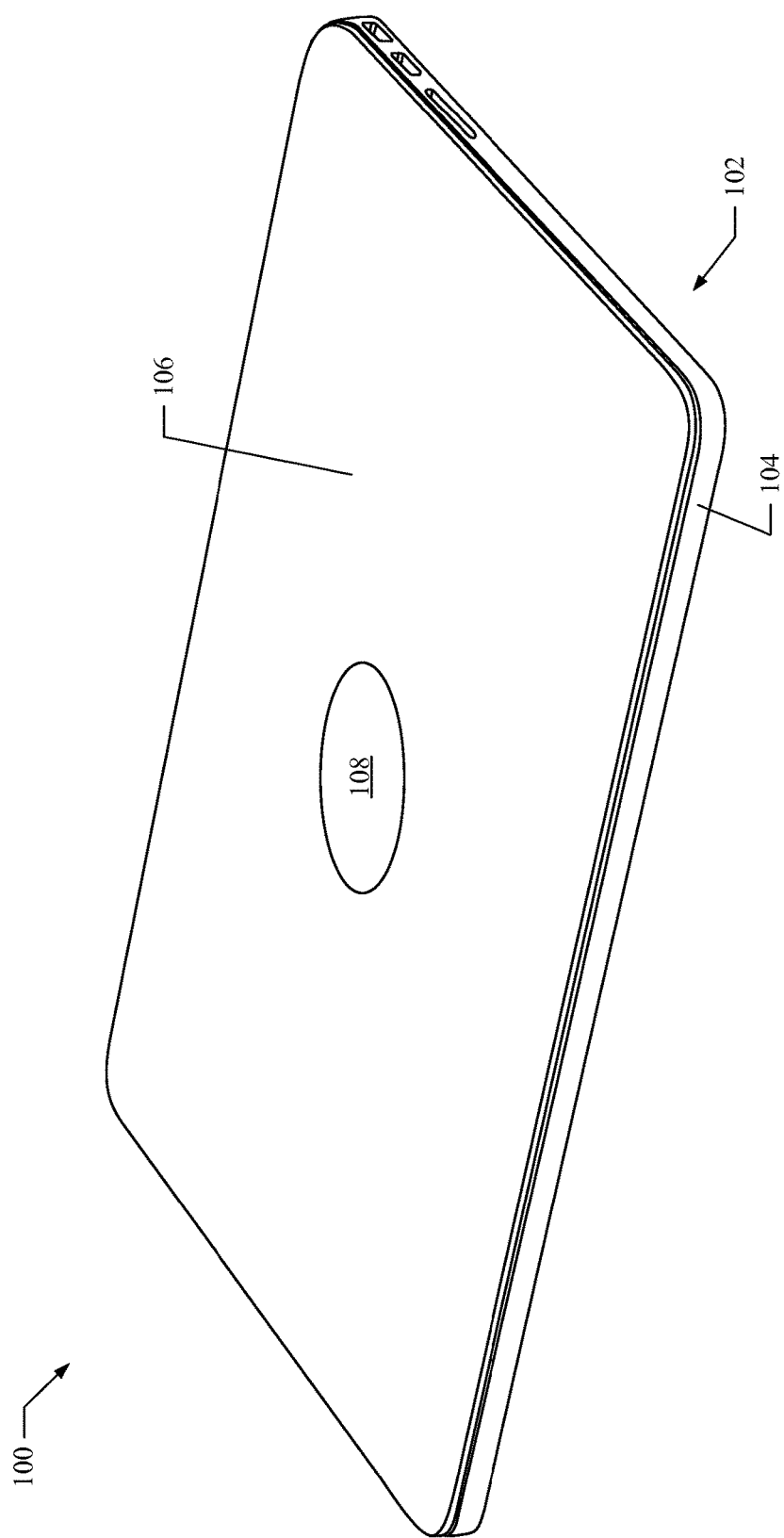
FIG. 1 illustrates an electronic device in a closed configuration.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to a localized corrective action of a component of an electronic device. In particular, some components have surfaces are configured to mate with another component of the electronic device. Issues arise when these surfaces are not within a specified tolerance. For example, an electronic device having a bump or burr on a mounting surface where a display is adhesively attached may lead to light leakage at the interface region between the display and the mounting surface. This is due in part to the display not contacting all portions of the mounting surface. Conversely, a mounting surface having a pit or an uneven surface may leads to a similar issue.

While some of these issues are a result of the machining process of the component itself, in some cases, components originally within an acceptable tolerance or specification limit may become out of tolerance during an assembly process. For example, a component may initially have a mating surface within 50 microns (from one of edge of a surface to another edge) and co-planar within 0.5 degrees, both of which may be within acceptable tolerance ranges. However, adding other components to the component with the mating surface may experience a co-planarity well above 0.5 degrees. When the mating surface is configured to receive, for example, a hinge assembly, the hinge assembly may no longer function properly.

Rather than discarding the assembled components, a localized corrective action can be done to the mounting surface during assembly and before the display is adhesively attached. For example, a lid having a mounting surface configured to receive a display may be inspected to determine whether the mounting surface is within the specified tolerance. If the inspection determines a disturbance (e.g., bump, burr, and pit) causes the lid not to be within the specified tolerance, the disturbance may be removed. If the inspection determines a pit or an uneven surface causes the lid not to be within the specified tolerance, the pit or uneven surface may be filled with, for example, a resin. In either event, the mounting surface treated with the localized corrective action causes the mounting surface to be within the specified tolerance. In this manner, the disturbance is corrected and losses due to yield fallout of the component are minimized.

These and other embodiments are discussed below with reference to FIGS. 1-25. However, those skilled in the art will readily appreciate that the detailed description given herein with respect to these Figures is for explanatory purposes only and should not be construed as limiting.

An illustrative electronic device 100 (e.g., a portable electronic device) in a closed configuration is shown in FIG. 1. More particularly, FIG. 1 shows a front facing perspective view of electronic device 100 in a closed configuration. As illustrated, electronic device 100 may include a housing 102 having a base 104, which may also be referred to as a lower portion or a main unit, and a lid 106, which may also be referred to as an upper portion or a cover. In some embodiments, base 104 and lid 106 are formed from a metal (e.g., aluminum).

In closed configuration, lid 106 and base 104 may form what appears to be a uniform structure having a continuously varying and coherent shape that enhances both the look and feel of electronic device 100. Lid 106 may include an indicium 108. In some embodiments, indicium 108 is a logo having a transparent or translucent portion through which light passes. Also, base 104 can be pivotally connected to lid 106 to allow for opening and closing of electronic device 100.

Figure 2:
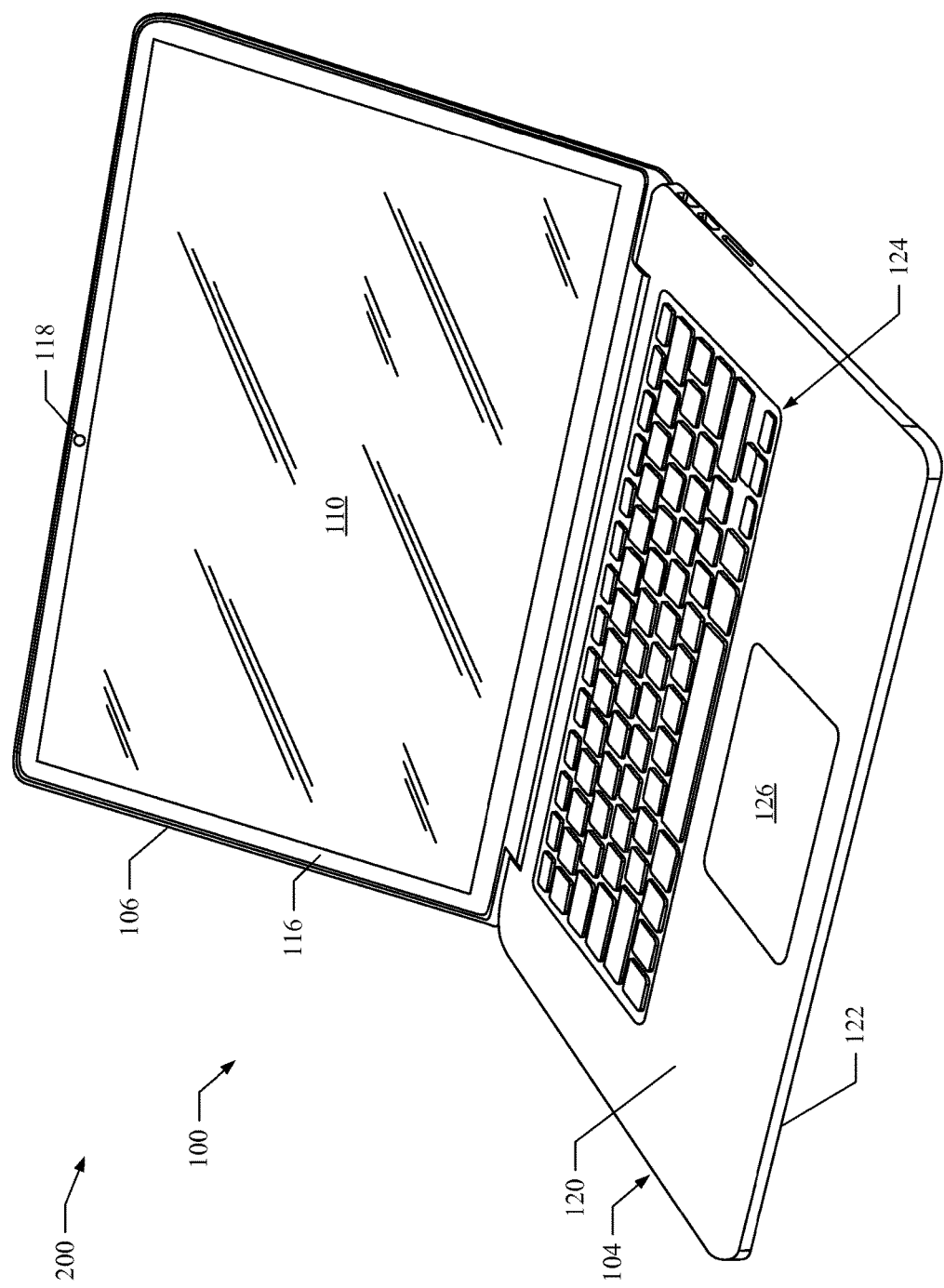
FIG. 2 illustrates the electronic device shown FIG. 1 in an open configuration.

FIG. 2 illustrates a front facing perspective view 200 of electronic device 100 in an open configuration. Display 110 may be coupled to lid 106 such that display 110 is provided with structural support. In this regard, lid 106 can be formed to have uni-body construction provided that can provide additional strength and resiliency which is particularly important due to the stresses caused by repeated opening and closing occurring during normal use. In addition to the increase in strength and resiliency, the uni-body construction of lid 106 can reduce an overall part count by eliminating separate support features, which may decrease manufacturing cost and/or complexity.

Lid 106 may include display trim 116 that surrounds display 110. Display trim 116 can be formed of an opaque material such as ink deposited on top of or within a protective layer of display 110. Thus, display trim 116 can enhance the overall appearance of display 110 by hiding operational and structural components as well as focusing attention onto the active area of the display.

Display 110 can display visual content such as a graphical user interface, still images such as photos as well as video media items such as movies. Display 110 can display images using any appropriate technology such as a liquid crystal display (LCD), a light emitting diode (LED) display, an organic light emitting diode (OLED) display, etc. Further, electronic device 100 may include image capture device 118. In one embodiment, image capture device 118 may be located on a transparent portion of display trim 116. Image capture device 118 can be configured to capture both still and video images in some embodiments.

Base 104 may include top case 120. As illustrated in FIG. 2, top case 120 can be configured to accommodate various user input devices such as a keyboard 124 and a touchpad 126. In particular, these user input devices may be exposed such that a user may interact therewith when the electronic device 100 is positioned in the open configuration.

Further, base 104 may include bottom case 122. Top case 120 and bottom case 122 of base 104 may cooperate to receive various other electronic and mechanical components therebetween. As may be understood, by way of example, the electronic components may include a mass storage device (e.g., a hard drive or a solid state storage device such as a flash memory device including non-transitory and tangible memory that may be, for example, volatile and/or non-volatile memory) configured to store information, data, files, applications, instructions or the like, a processor (e.g., a microprocessor or controller) configured to control the overall operation of the portable electronic device, a communication interface configured for transmitting and receiving data through, for example, a wired or wireless network such as a local area network (LAN), a metropolitan area network (MAN), and/or a wide area network (WAN), for example, the Internet, a fan, a heat pipe, and one or more batteries.

Figure 3:
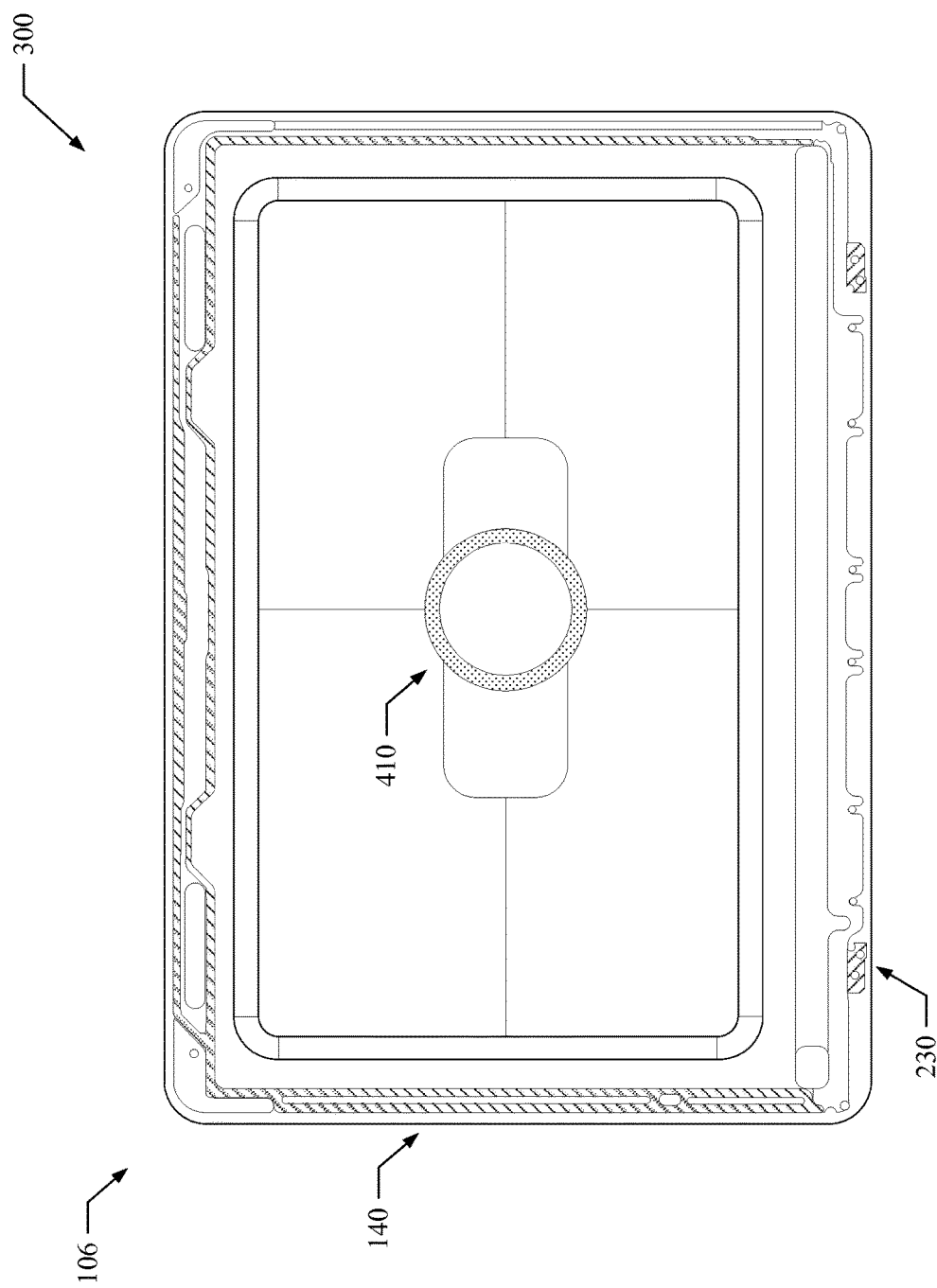
FIG. 3 illustrates an inner portion of a lid of an enclosure.

FIG. 3 illustrates a top view 300 showing an inner portion of lid 106 of electronic device 100 having several dimensions used as mating surfaces for receiving various components. For example, lid 106 includes first surface 140 extends around several lateral sides of lid 106. In some embodiments, first surface 140 is configured to receive display 110 (shown in FIG. 2). Also, lid 106 includes second surface 230 configured to receive a hinge assembly (not shown) which may facilitate opening and closing of lid 106 relative to base 104. Also, lid 106 includes third surface 410 configured to receive indicium 108 (shown in FIG. 1).

Figure 4:
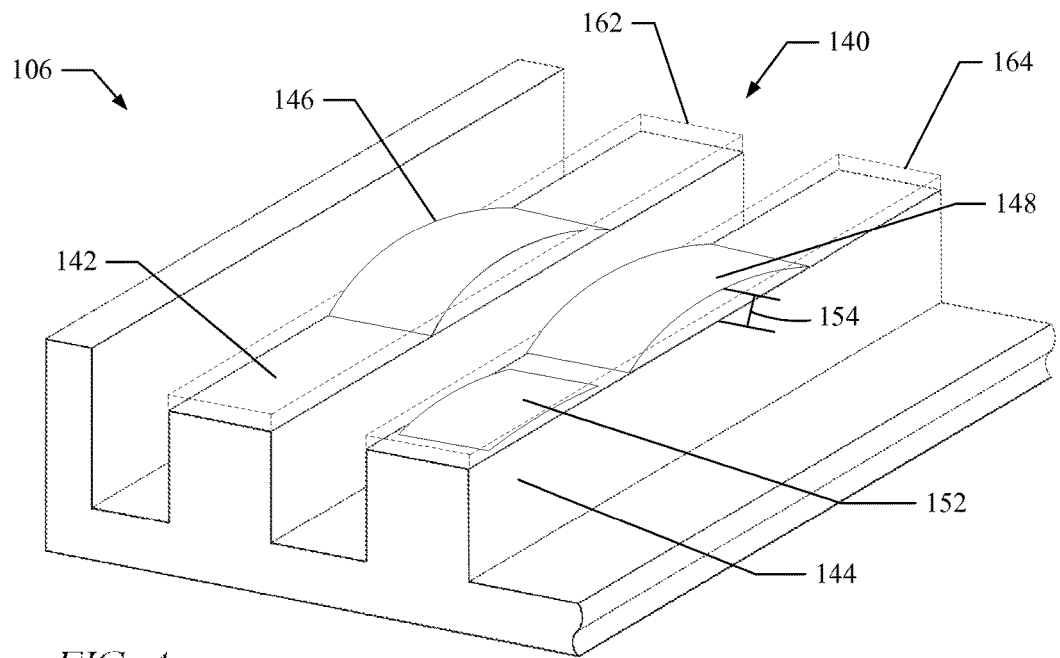
FIG. 4 illustrate an isometric view of an enlarged area of the lid in showing first surface having a first rail and a second rail, the first rail and second rail include a first protrusion and a second protrusion, respectively.

Although first surface 140, second surface 230, and third surface 160 are generally level or flat, the machining process used to produce these surfaces may leave behind unwanted material. Alternatively, these surface may become warped or simply out of a specified tolerance during an assembly process. For example, FIG. 4 illustrates an isometric view of an enlarged portion of lid 106 showing first surface 140 having first rail 142 and second rail 144; first rail 142 and second rail 144 include first protrusion 146 and second protrusion 148, respectively. Second rail 144 further includes third protrusion 152. Generally, first protrusion 146 and second protrusion 148 are undesirable or unwanted portions remaining after the machining process of lid 106. First protrusion 146 and second protrusion 148 could be a bump, a burr, or other particle. Also, any protrusion, when protrusion height 154 (e.g., of second protrusion 148) is 15 microns or greater, an adhesive layer (not shown) having a height approximately 30 microns may be unable to flow or extend along first rail 142 and/or second rail 144 in a desired manner.

Also, FIG. 4 shows first tolerance 162 and second tolerance 164 as imaginary lines superimposed on first rail 142 and second rail 144, respectively. First tolerance 162 and second tolerance 164 may be predetermined tolerances or specifications such that a part having dimensions within these tolerances can receive another part in a proper manner First tolerance 162 and second tolerance 164 correspond to a maximum tolerance height for first rail 142 and second rail, respectively. As shown in FIG. 4, a portion of first protrusion 146 and a portion of second protrusion 148 are positioned above first tolerance 162 and second tolerance 164, respectively (e.g., protrusion height 154 is above a vertical height of second tolerance 164). In other words, first protrusion 146 and second protrusion 148 deviate from first tolerance 162 and second tolerance 164, respectively, making first rail 142 and second rail 144 non-compliant structures. As a result, lid 106 is not with the predetermined tolerance which may cause an issue when first surface 140 receives a display. For example, an adhesive layer 166 (shown in FIG. 5) may not pass over first protrusion 146 and/or second protrusion 148. However, third protrusion 148 is positioned within second tolerance 172, and as such, is small enough such that adhesive layer 155 passes over third protrusion 148.

Figure 5:
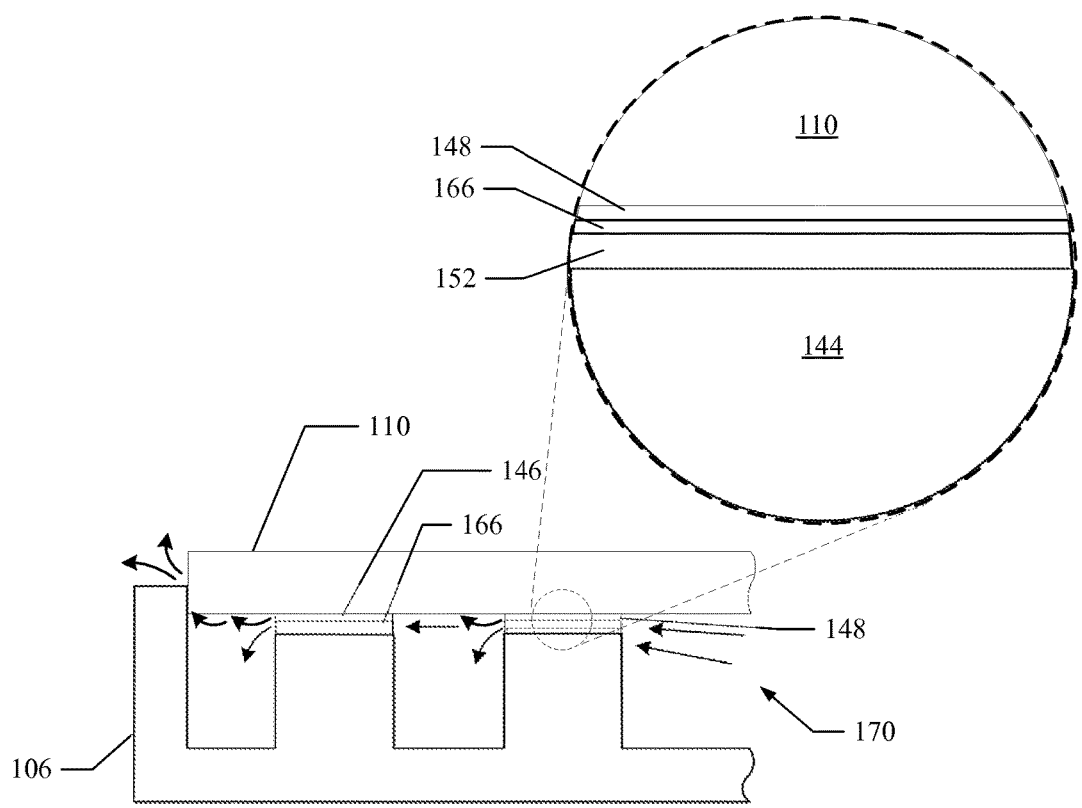
FIG. 5 illustrates a side view of enlarged portion in FIG. 4, showing protrusions causing the display to rest unevenly on first and second rail, which in turn causes light rays to escape from the lid.

FIG. 5 shows a side view of the enlarged portion in FIG. 4, where first protrusion 146 and second protrusion 148 can cause adhesive layer 166 to become stagnant, i.e., adhesive layer 188 cannot flow over either first protrusion 146 and second protrusion 148. As a result, display 110 is not adhesively attached to first rail 142 and second rail 144, thereby allowing light rays 170 from a light source previously described pass through an area proximate to first protrusion 146 and second protrusion 148, and ultimately escape lid 106.

Figure 6:
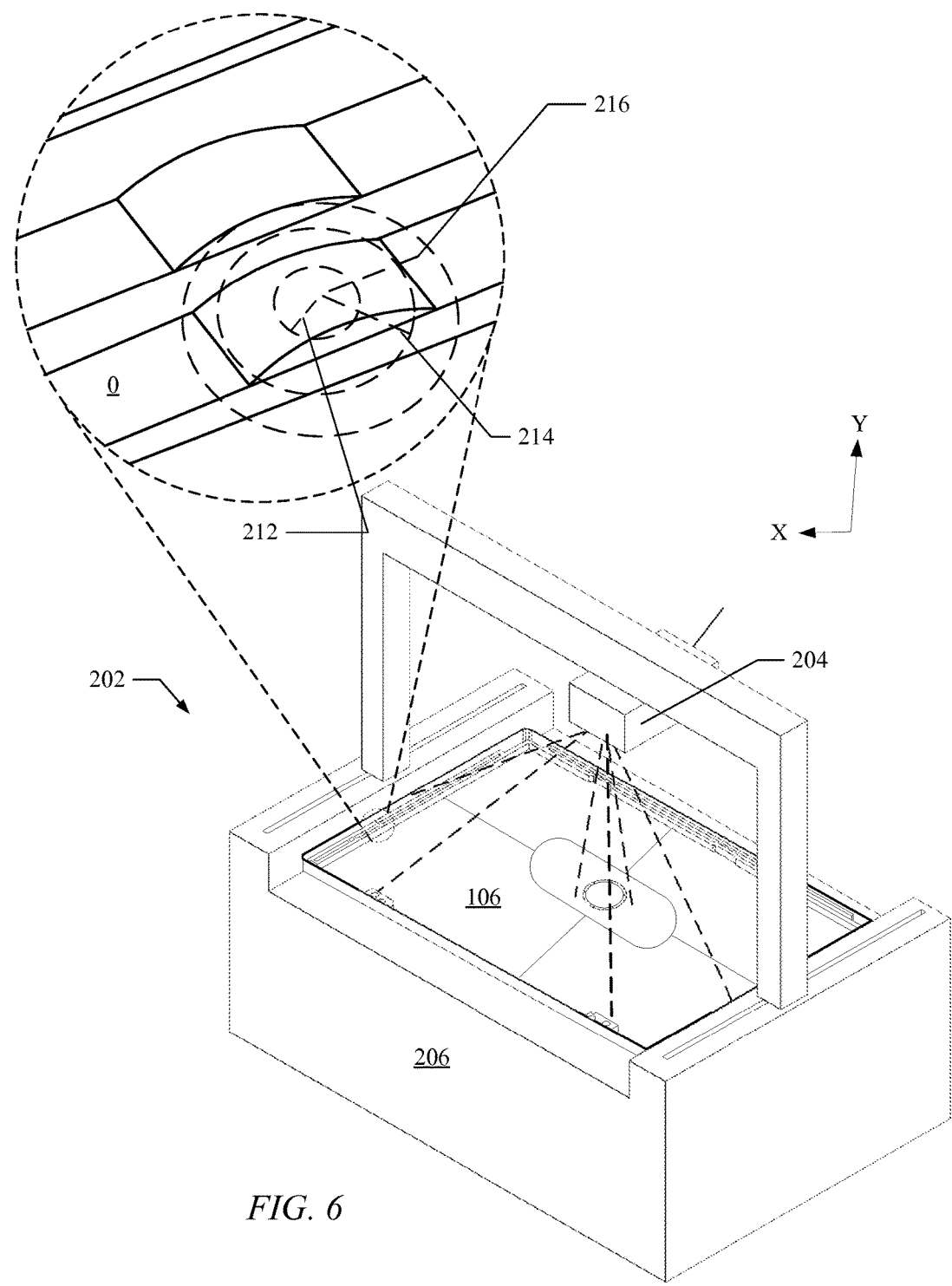
FIG. 6 shows the lid positioned in an automated optical inspection ("AOI") system configured to detect protrusions or other irregularities on the various surfaces of the lid.

In order locate (and subsequently remove or reduce) deviating portions, an inspection system may be used to inspect lid 106 for protrusions. FIG. 6 shows lid 106 positioned in inspection system 202. In some embodiments, inspection system 202 is an automated optical inspection ("AOI") system configured to detect protrusions or other irregularities on the various surfaces of lid 106. Inspection system 202 includes vision system 204 and fixture 206. Fixture 206 is configured to hold a component (e.g., lid 106) in place during inspection. In some embodiments, vision system 204 includes several lasers (non-ablation) emitting laser light rays at various portions of a component, such as the mating surfaces of lid 106. In this manner, each laser measures a distance from lid 106 to vision system 204. These distances may be sent to a computing device having software and a processor, both of which are configured to compare the distances to, for example, a predetermined tolerance for lid 106. In other embodiments, vision system 204 captures an image of lid 106, and then sends the image to a computing device (not shown) having software and a processor, both of which are configured to compare the captured image to predetermined tolerances of lid 106. In either event, the comparisons may reveal a deviating portion, or portions, of lid 106. If the deviating portion is above the predetermined tolerance, then vision system 204 or the computing device signal a removal tool (discussed later) to remove or reduce the deviation portion of lid 106 in order to place lid 106 within the predetermined tolerance.

In the embodiment shown in FIG. 6, vision system 204 superimposes a grid or map configured to target several predetermined portions of lid 106. In one embodiment, vision system 204 is configured to include approximately 20-25 predetermined points. During inspection, vision system 204 can use the grid to calculate a radius of curvature of an object to detect irregularities. For example, in the enlarged view in FIG. 6, a portion of second rail 144 includes protrusion having first radius of curvature 212, second radius of curvature 214, and third radius of curvature 216. The radii of curvature are determined by vision system 204 and shown as dotted lines. Each radius of curvature corresponds to a circle (also in dotted lines) having a radius equal to the radius of curvature. Vision system 204 can be configured such that if a radius of curvature is less than a predetermined radius of curvature corresponds to a protrusion or irregularity in that location. Also, the predetermined tolerance may be input into vision system 204 (and subsequently adjusted) by an operator.

In the exemplary embodiment, the predetermined tolerance is third radius of curvature 216. As shown in FIG. 6, first radius of curvature 212 and second radius of curvature 214, both of which are less than third radius of curvature 216, would correspond to protrusion thereby signaling a removal tool (discuss later) to perform a removal process on second rail 144. In any of the described embodiments, inspection system 202 is generally automated in that vision system 204 may traverse relative to fixture 206 in the x- and/or y-directions. Also, it should be appreciated that vision system 204 selected is configured to detect protrusions on the order of microns in order to detect protrusions which may cause issues previously described.

Figure 7:
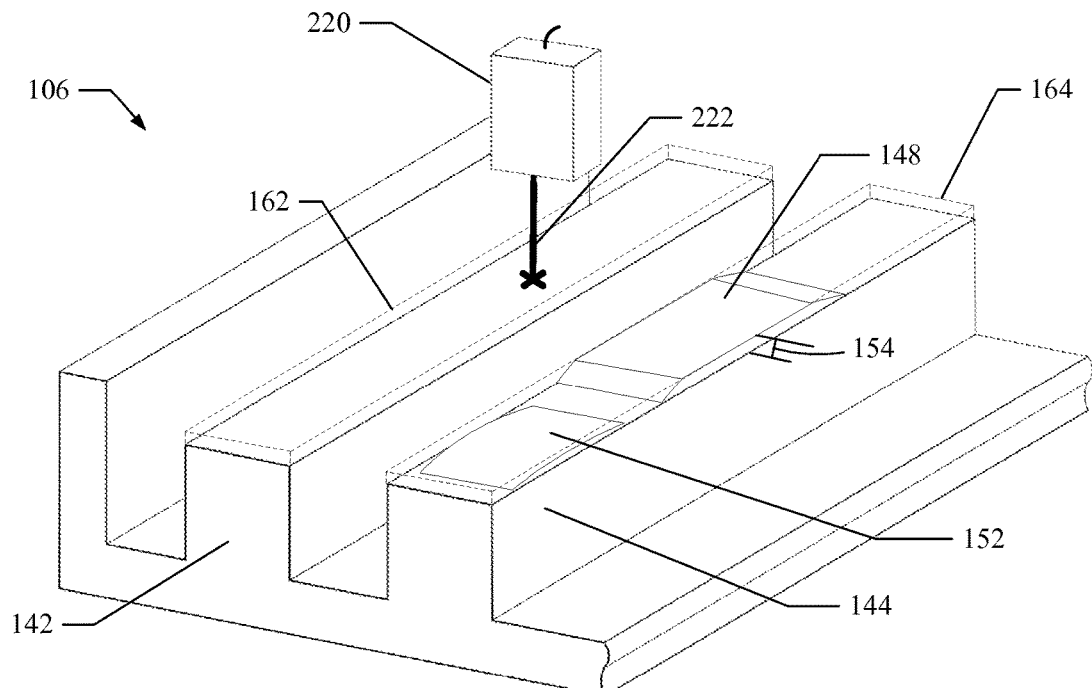
FIG. 7 shows an isometric view of the enlarged portion shown in FIG. 4, with a removal tool positioned over the first rail, and removing the protrusion previously on the first rail.

Once a protrusion is located by vision system 204, the protrusion may be removed by a removal tool. FIG. 7 shows an isometric view of the enlarged portion shown in FIG. 4, with removal tool 220 positioned over first rail 142, and removing the protrusion previously on first rail 142. Removal tool 220 is configured to receive a signal, or instructions, by vision system 204 (in FIG. 6), and remove a protrusion in a location determined by the vision system. In some embodiments, removal 220 removes a portion of a protrusion such that the protrusion is within first tolerance 162 as it may not be necessary to remove the entire protrusion. For example, FIG. 7 also shows protrusion height 154 of second protrusion 148 reduced to a height within second tolerance 164. Accordingly, second protrusion 148 is no longer deviant in this location. By removing only a portion of a protrusion, manufacturing times may be reduced which leads to faster assembly.

In the embodiment shown in FIG. 7, removal tool 220 is a laser configured to perform a laser ablation to a surface in order to remove undesired material. The width (diameter) of laser beam 234 is a fixed width approximately in the range of 50-70 microns. Also, laser beam 234 includes a fixed power of at least 4 kilowatts. Empirical results have shown that removal tool 220 can remove a portion of a part having a depth ranging from approximately 100-200 microns without affecting the functionality of the part.

In some embodiments, removal tool 220 traverses along lid 106 to a location in which a protrusion is detected. In other embodiments, removal tool 220 is generally stationary, but includes a movable head configured to direct laser beam 212 to a location in which a protrusion is detected. Also, it should be noted that ablation times depends on the number of protrusion found as well as the size of the protrusions. Regarding the latter, ablation time is proportional to the height of the protrusion. In other words, a relatively longer ablation times is associated with a protrusion having a relatively greater height. Ablation time may also be dependent upon whether the protrusion is completely removed.

Figure 8:
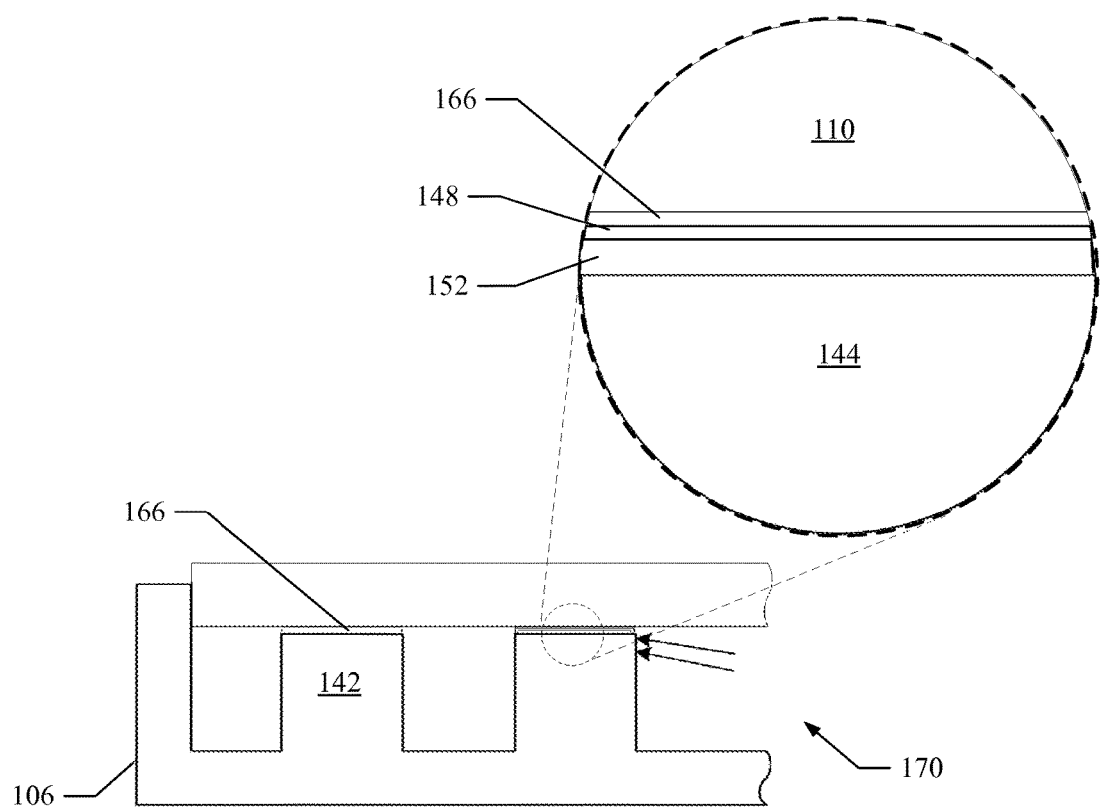
FIG. 8 illustrates the side view shown in FIG. 5, with the protrusions removed by the removal tool, thereby allowing the display to rest evenly on the rails.

FIG. 8 shows a side view of the enlarged portion in FIG. 7, with the protrusions removed or reduced by removal tool 220. For example, the first protrusion on first rail 142 is essentially removed, while a portion of second protrusion 148 remains after the removal process. Also, third protrusion 152 does not require attention by removal tool 220 as third protrusion 152 is already within the predetermined tolerance. As a result, adhesive layer 166 flows over first rail 142 and second rail 144 such that display 110 is adhesively attached to first rail 141 and second rail 143 in a desired manner. Accordingly, light rays 170 are unable to extend past second rail 144 and remain within lid 106. The close-up view in FIG. 8 shows adhesive layer 166 flowing over both second protrusion 148 and third protrusion 152. Also, in other embodiments, a patch may be placed on a laser ablated portion of, for example, first rail 142. The patch may be used to correct an over-ablated area and/or configure first rail 142 to receive adhesive layer 166.

Figure 9:
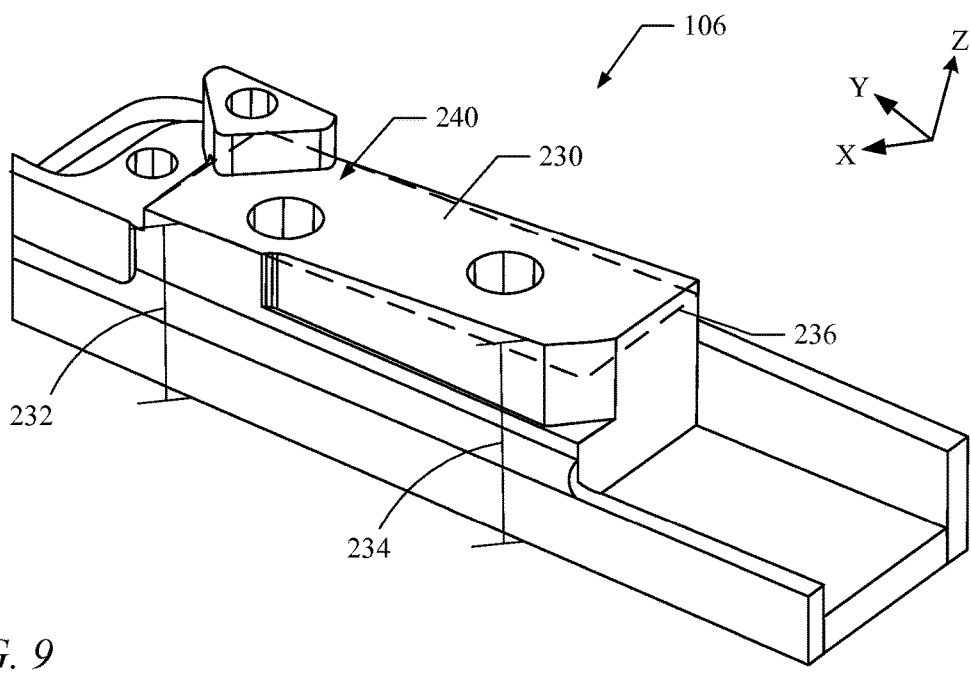
FIG. 9 illustrates an isometric view of second surface configured to receive a hinge assembly.

In addition to locating protrusions or irregularities on mounting surfaces configured to receive a display, the inspection system can be used to detect other types of irregularities in other portions of a lid. For example, FIG. 9 shows an isometric view of second surface 240 (shown in FIG. 3). In this embodiment, second surface 230 is a surface configured to receive a hinge assembly (not shown). However, second surface 230, as shown in FIG. 9, is uneven, or non-level, such that the hinge assembly mounted on second surface 230 cannot properly open and close a lid. In particular, first height 232 is less than second height 234, where first height 232 and second height 234 are measured vertically from a lower portion of lid 106 to second surface 230. If the inspection system previously described determines first height 232 and/or second height 234 is not within a predetermined tolerance, the inspection system may signal to removal tool 220 to remove portions of second surface 230. For example, FIG. 9 shows second height 234 above third tolerance 236, with third tolerance 236 corresponding to a compliant surface height for second surface 230. In is shown FIG. 10, removal tool 220 removes a portion of second surface 230 such that a newly formed third height 238 is at or below third tolerance 236.

Figure 10:
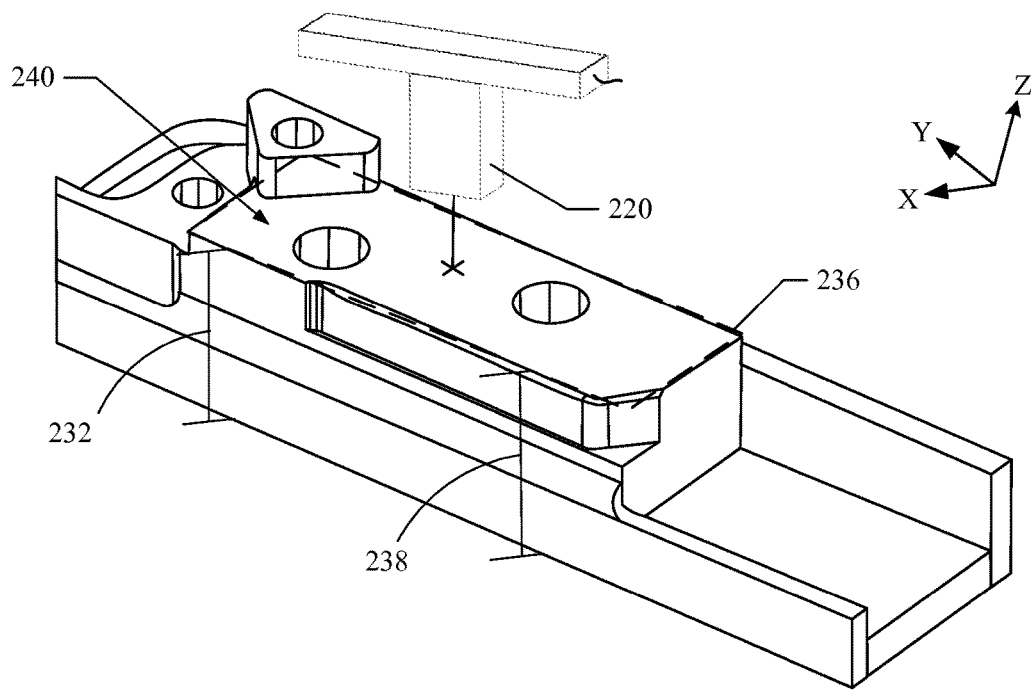
FIG. 10 illustrates an isometric view of the second surface shown in FIG. 9, with a removal tool removing a portion of the second surface such that the second surface is even, or level.

In some embodiments, removal tool 220 removes portions of second surface 230 such that second surface 230 is approximately at first height 232 (i.e., the portion of second surface having the lowest height) across the entire area of second surface 230. Still, in other embodiments, the inspection system can select a reference surface on second surface 230 and signal removal tool 220 to remove a portion of a second surface 230 in accordance with the reference surface. In other words, after the removal process, second surface 230 is substantially co-planar, or flush, with respect to the reference surface. For example, FIGS. 9 and 10 show reference surface 240 on second surface 230. The inspection system can use reference surface 240 as a base reference and signal removal tool 220 in the manner described. Reference surface 240, as used in FIGS. 9 and 10, is only intended for purposes of description and does not demarcate a precise location on second surface 230. Generally, reference surface 240 is a portion having a relatively low elevation, or z-height, with respect to the entire surface (e.g., second surface 230). Also, it should be understood that reference surface 240 is within a predetermined tolerance or specification.

Once the removal process previously described is performed, lid 106 may be placed back in the inspection system previously for further inspection (i.e., second scan) to determine whether the removal process places lid 106 with the predetermined tolerance. If the inspection system determines, for example, all surfaces are within their predetermined tolerances, lid 106 may proceed to the next step. For example, a display may be adhesively attached to lid 106. On the other hand, if lid 106 fails the inspection, lid 106 can undergo further removal process until a subsequent inspection by the inspection system indicates a pass. It should be understood that a "pass" or "fail" corresponds to whether lid 106 is within a predetermined tolerance or other acceptable measure. This approach ensures that a high-value component (e.g., display) is not adhesively attached to lid 106 until lid 106 includes acceptable mounting surfaces. This process improves quality control by not only reducing light leakage but also reducing yield fallout.

Also, after lid 106 pass the inspection, lid 106 may be placed in a cleanroom environment (not shown) for further processing. The cleanroom may be used to remove any ablated material or other debris generated by the removal tool previously described in order to ensure the surface (e.g., mounting surface) is capable of receiving another part (e.g., display, hinge assembly) in a desired manner. The removal means in the cleanroom environment may include an air knife, air blade, and/or an air nozzle connected to an air supply. Also, the cleanroom environment may include a sealed hood to control airflow within the cleanroom environment.

In addition to protrusions, other irregularities may be present on a mating surface. For example, prior to assembly, a part such as a lid may have an associated flatness, or alternatively, at least two portions of a part may have an associated co-planarity with respect to each other that is acceptable for use. However, during assembly, the previously acceptable parts mated or assembled with another component or components causes a change in flatness or co-planarity such that the part no longer includes a surface with acceptable flatness or co-planarity. The inspection and removal process previously described may be used to remove portions of surfaces such that the parts are again with an acceptable flatness or co-planarity.

Also, in some cases, during the manufacturing process of a part (e.g., lid 106), the part may be purposely machined or manufactured with additional material on certain portions (e.g., mounting surfaces). In this regard, the part will purposely be put through a removal process (e.g., laser ablation) prior to mating with another part. Any issues with excessive removal may be solved by the thickness of the adhesive layer used to mate the two parts and/or a material (e.g., resin) use to build up, or add to, the mounting surface (discussed below). Using an inspection system and removal tool previously described, both of which include relatively tight tolerance controls, may require less attention to detail with respect to machining the part. In this regard, less time spent machining or forming the part may be acceptable as the tightly controlled inspection and removal processes may place the part in a compliant manner. In some cases, this may reduce manufacturing times and costs related to the part.

The foregoing process generally concerns removing a portion of material from a surface in order to correct and or improve the surface functionality. However, in some cases, a surface may include insufficient material caused by either during manufacture of the part, or a subsequent manufacturing process. In these cases, an additive process may be desirable.

Figure 11:
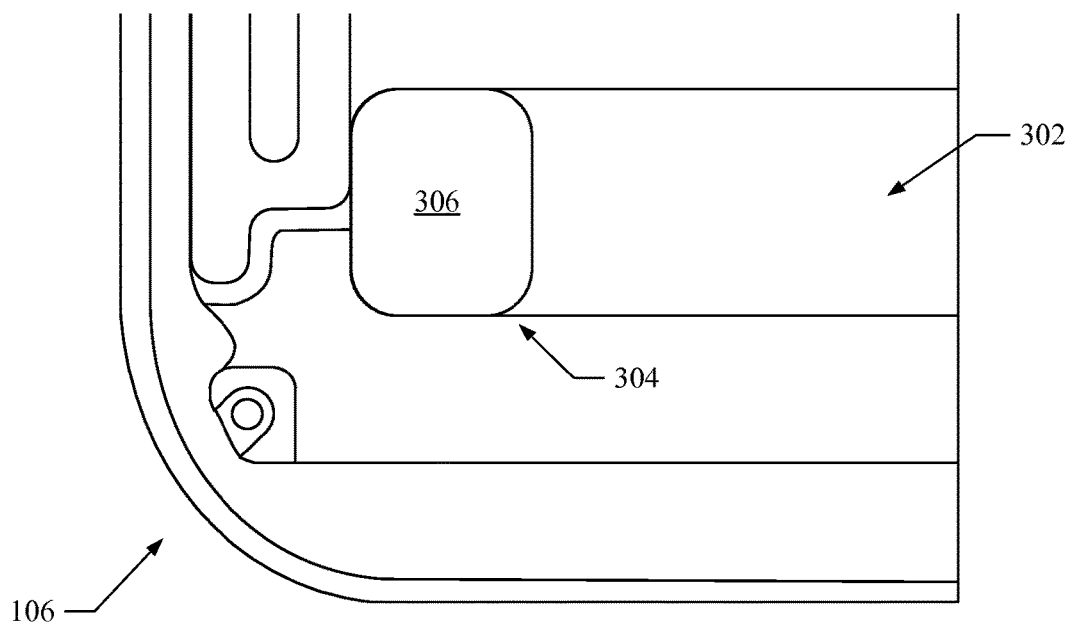
FIG. 11 illustrates a corner of the lid having a first cutting area and a second cutting area overlapping a portion of the first cutting area.

FIG. 11 shows a corner of lid 106 having a portion with multiple machining processes performed. For example, a first cutting tool (not shown) is used to form a first cutting area 302 generally along lid 106 (see also, FIG. 3). First cutting area 302 is generally configured to create additional room for at least one component in the electronic device, or to remove excessive material thereby reducing weight. However, in order to make more precise cuts near the edge of lid 106, a second cutting tool (not shown) is used to form a second cutting area 304 which may be used to create a stiffening portion for an LED used for backlighting. As shown in FIG. 11, a portion of second cutting area 304 overlaps with first cutting area 302, shown as overlap region 306. Because the first and second cutting tools are different, first cutting area 302 and second cutting area 304 may include varying depths. In addition, first and second cutting tools may generally cut different surfaces of lid 106. Also, during a material removal process, the first and second cutting tools generally apply different forces to a lid 106. Also, because the first and second cutting tools are different, there may be different tolerances associated with the cutting tools. In some cases, second cutting area 304 includes a region deeper than first cutting area 302 by up to 50 microns. Due to the varying depths, when second cutting area 304 overlaps first cutting area 302, light leaking from the LED may occur in the overlapped region 306, and ultimately escape lid 106.

Figure 12:
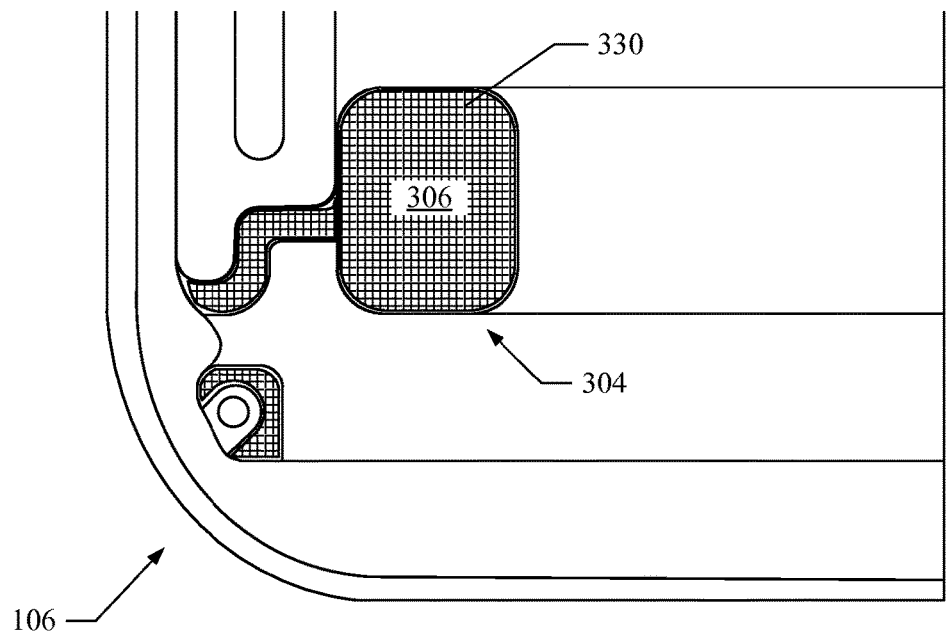
FIG. 12 illustrate the corner shown in FIG. 11, with a material filled in the overlapping portion.

FIG. 12 shows the second cutting area 304 as well as the overlap region 306 filled with a material 330. In some embodiments, material 330 a resin such as an elastomeric resin. Material 330 is configured to make second cutting area 304 generally co-planar, or flush, with first cutting area 302. As a result, light leakage is in this portion of lid 106 is reduced or prevented. Also, in addition to material 330 forming co-planar surfaces, material 330 is generally opaque such that light does pass through material 330. It should be noted that an inspection system previously described may also be configured to determine areas where the additive process may be performed. In other words, the inspection system may incorporation predetermined tolerances in any manner previously described to ensure compliant surfaces.

Also, subsequent to applying material 330, lid 106 may be placed in the inspection system for further inspection to ensure material 330 is added in a desired manner. However, it should be noted that in some embodiments, a profilometer (not shown) is used to measure material 330 to ensure material is flush with first cutting area 302 or surrounding portions of lid 106.

Generally, the time required for the additive process depends at least in part on the width of the print material as well as the amount of material required to form a flush surface. In some embodiments, the printing machine (not shown) used to apply material 330 is configured to print material 330 having a width approximately in the range of 0.5 mm to 2 mm. Also, in some embodiments, material 330 includes several layers of printed material, with subsequent layers stacked on previous applied layers.

Figure 13:
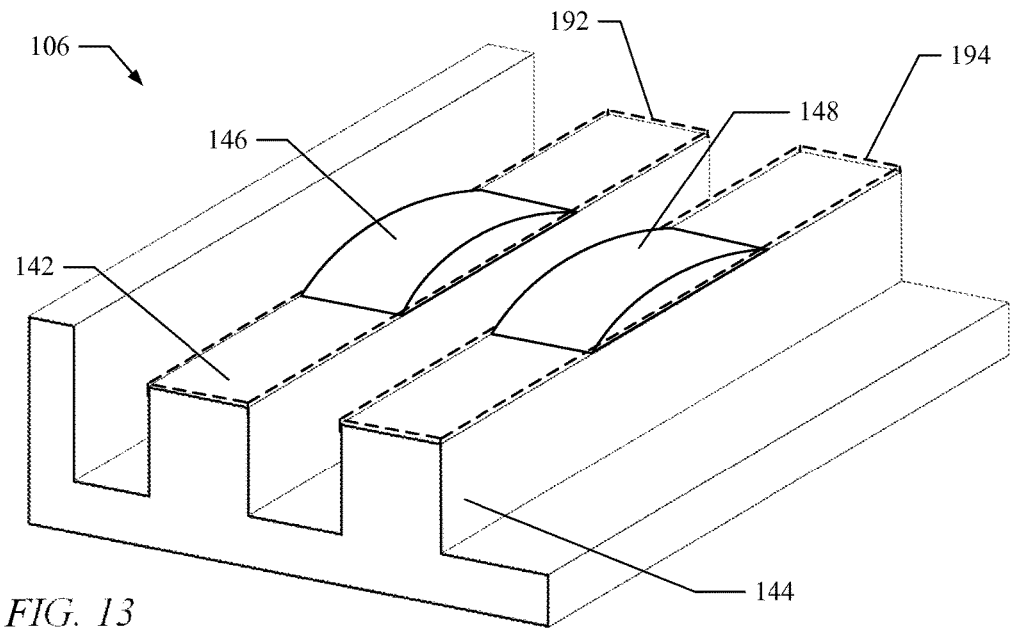
FIG. 13 illustrates the isometric view of an enlarged area of the lid in showing, similar to FIG. 4.
Figure 14:
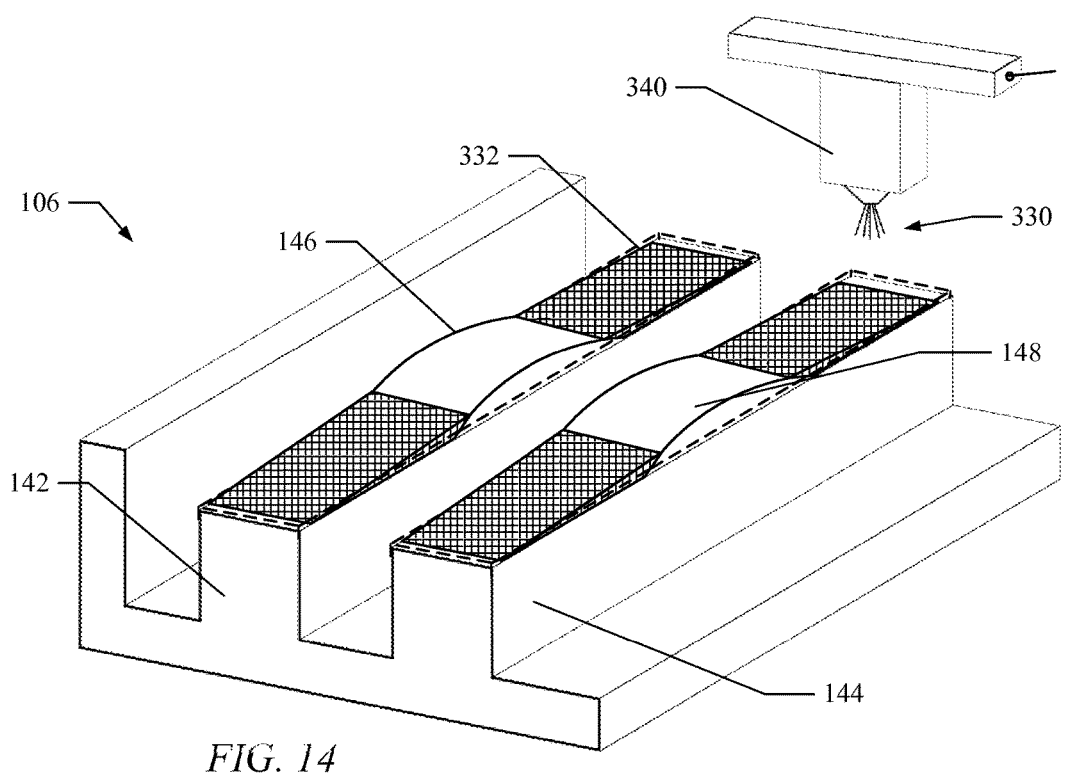
FIG. 14 illustrates the view in FIG. 13, with a material formed around a first and second protrusion.

FIG. 13 an isometric view of an enlarged portion (similar to FIG. 4) of lid 106 showing first surface 140 having first rail 142 and second rail 144; first rail 142 and second rail 142 include first protrusion 146 and second protrusion 148. Rather than using a removal tool, as shown in FIG. 8, in some cases, a material can be added to first protrusion 146 and second protrusion 148 such that first rail 142 and second rail 144 are within first tolerance 192 and second tolerance 194, respectively. FIG. 14 shows material 330 applied to first rail 142 and second rail 142 to form inclined portions. For example, first rail 142 includes first incline portion 332. By doing so, an adhesive layer (not shown) is capable of flowing over first protrusion 146 and second protrusion 148. In some embodiments, material 330 is applied by print head 340 which is part of an inkjet printing machine capable of communicating with the inspection system to receive instructions, and actuating print head 340 in two dimensions to apply material 330 based on the instructions. In other embodiments, print head 340 is controlled by an X-Y machine capable of communicating with the inspection system in a similar manner. In some cases, the X-Y machine may lower or raise print head 340 as needed. In the embodiment shown in FIG. 14, material 330 is applied by print head 340 which is part of three-dimensional printer (not shown).

FIG. 14 illustrates an additive manufacturing process as a substitution to a removal process. This may be desirable in situations where the number of additive processes outnumbers the number of removal processes to be performed on the part such that performing both additive and removal processes may require additional manufacturing time. However, it should be understood that in some embodiments, both a removal process and an additive material process is performed on a part.

Figure 15:
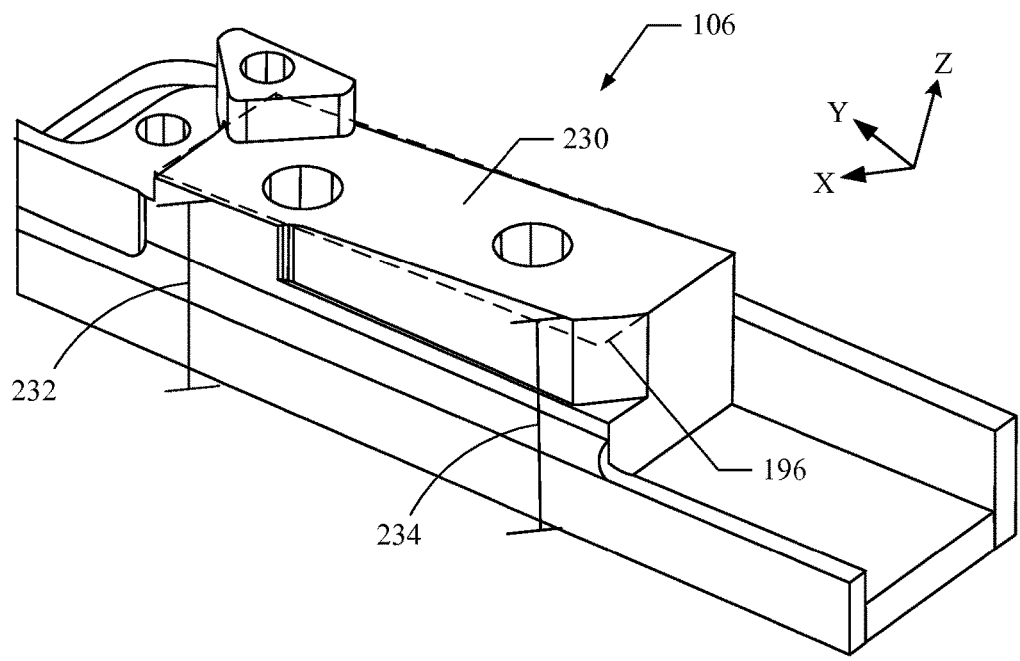
FIG. 15 illustrates the second surface similar to the second surface shown in FIG. 9.
Figure 16:
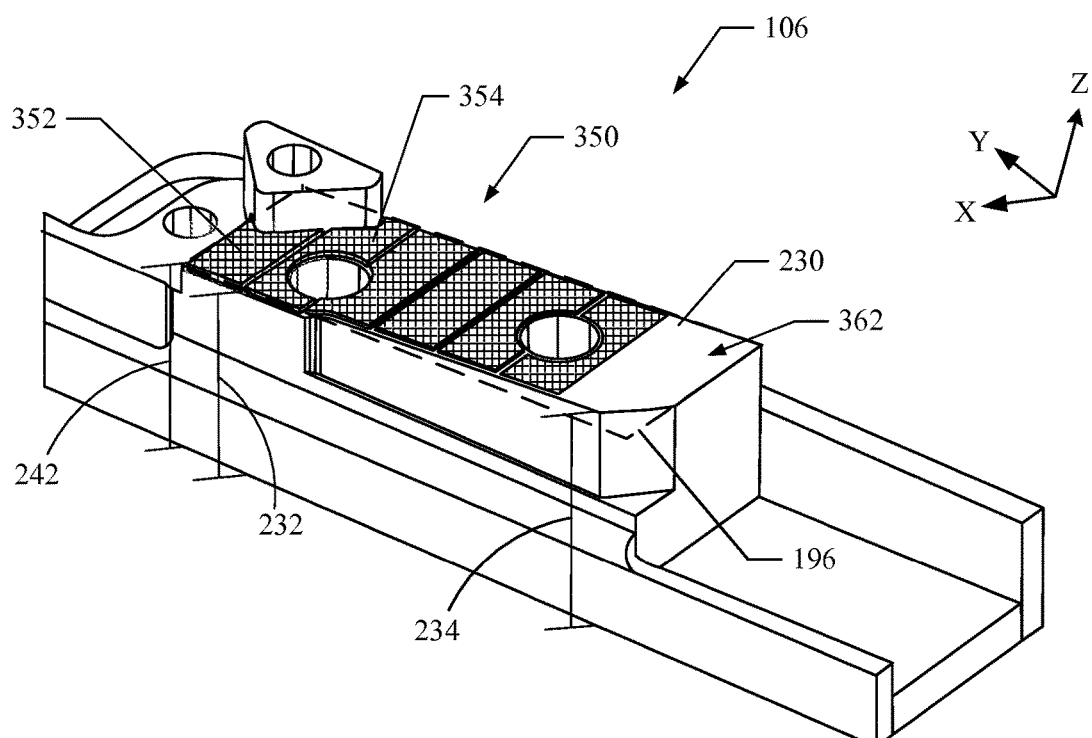
FIG. 16 illustrates the second surface shown in FIG. 15, with a material formed on the second surface.

FIG. 15 shows an isometric view of second surface 230 (similar to FIG. 9) configured to receive a hinge assembly. Recall second surface 230 includes first height 232 is less than second height 234, where first height 232 and second height 234 are measured vertically from the bottom of lid 106 to second surface 230. As shown in FIG. 16, rather than removing portions of second surface 230, a print head (not shown) may be configured to add several print segments 350 to second surface 230 such that second surface 230 combined with print segments 350 form a surface within tolerance 196. In some embodiments, print segments 350 are made from a material similar to the elastomeric resin previously described. In the embodiment shown in FIG. 16, print segments 350 are formed from a more rigid resin material as compared to the elastomeric resin material used on first rail 142 and second rail 144, shown in FIG. 14. In this manner, print segments 350 can support a hinge assembly which may create additional stress on second surface 230. Also, similar to the removal process of second surface 230 (shown in FIG. 10), the additive process in FIG. 16 allows a hinge assembly positioned on material 350 to function in a desired manner.

An inspection system previously described may be configured to inspect second surface 230 for uneven portions, and signal to a print head (not shown) to add print segments 350 to certain portions of second surface 230. For example in FIG. 16, third height 242 may include a combined height of first height 232 and a vertical height of first print segment 352. Accordingly, in some embodiments, the inspection system signals the print head previously described to add print segments 350 to certain portions such that third height 242 is substantially similar second height 234. In some embodiments, the inspection system signals the print head to form print segments 350 such that second surface 230 combined with print segments 350 is within predetermined tolerance 196. Also, in some embodiments, the inspection system is configured to select a reference surface and signal the inspection system to add material 350 in accordance with the reference surface. For example, FIG. 16 shows reference surface 362 near a portion of second surface 230 having second height 234. The inspection system uses reference surface 362 as a base reference and signals print head 340 to add print segments 350 in the manner described. In other words, second surface 230, combined with the print segments shown in FIG. 16, is generally flat. It should be understood that print segments 350 should have varying heights in order to achieve this. For example, first print segment 352 includes a z-height greater than that of second print segment 354, and so on. Reference surface 362, as used in FIG. 16, is only intended for purposes of description and does not demarcate a precise location on second surface 230. Generally, reference surface 336 is a portion having a relatively high elevation, or z-height, with respect to the entire surface.

Figure 17:
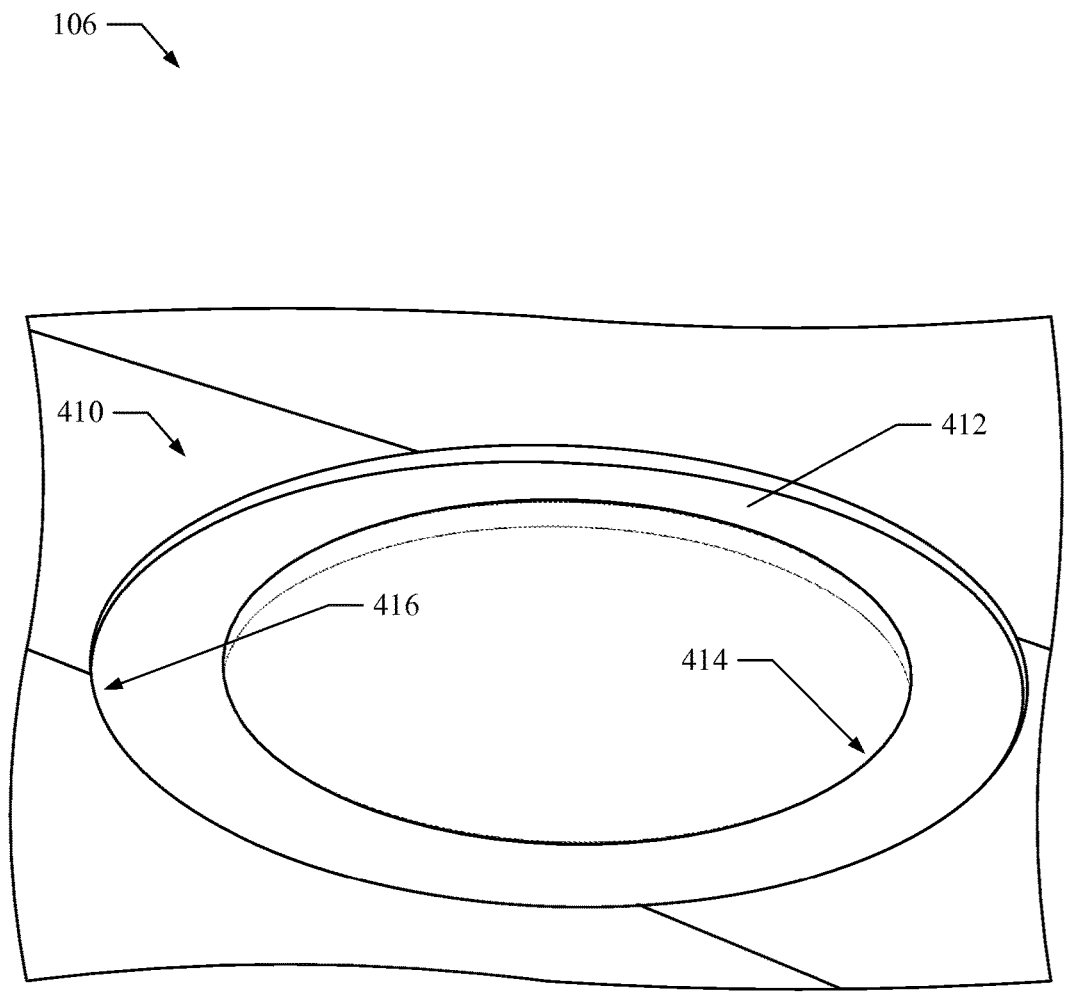
FIG. 17 illustrates an isometric view of a third surface on the lid, the third surface configured to receive an indicium.
Figure 18:
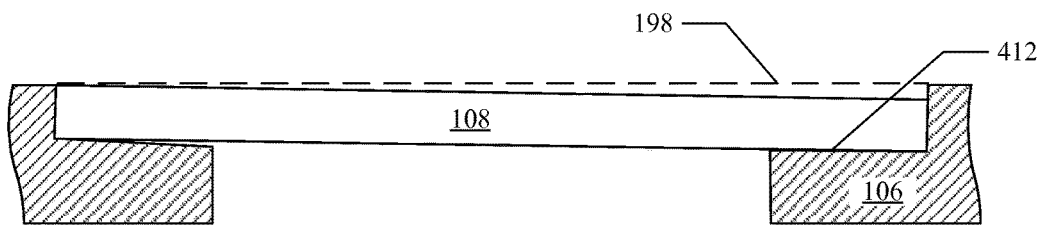
FIGS. 18 and 19 illustrate cross sectional view of the lid in FIG. 17, with FIG. 19 showing a material formed on an offset portion of the lid.

Other portions of lid 106 may require additional material. For example, FIG. 17 illustrates an isometric view of an enlarged portion of lid 106 showing third surface 410 (shown in FIG. 3). Third surface 410 includes an offset portion 412 configured to receive an indicium previously described. In addition, offset portion 412 may also receive an adhesively layer which adhesively bonds the indicium to offset portion 412. In some cases, offset portion 412 may be machined in a manner such that when the indicium is placed within offset portion 412, the indicium is sub-flush, or below, the portion of lid 106 surrounding offset portion 412. In the embodiment shown in FIGS. 17-20, offset portion 412 is machined unevenly thereby creating an uneven surface for the indicium, with at least some portion creating the aforementioned sub-flush situation. For example, FIG. 18 shows a cross section of lid 106 and offset portion 412 shown in FIG. 17, with indicium 108 is positioned on offset portion 412. Offset portion 412 includes varying heights, as measured from a lower portion of lid 106 to the surface of offset portion 412, such that indicium 108 is not within predetermined tolerance 198. Predetermined tolerance 198 may be determined an inspection system previously described.

Figure 19:
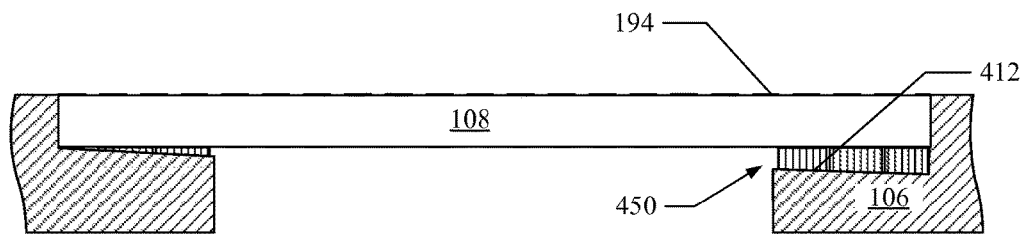

However, offset portion 412 can be rectified by adding material in order to place indicium 108 within tolerance 198. FIG. 19 shows offset portion 412 filled with print segments 450 such that indicium 108 is not only flat when positioned within lid 106, but also co-planar with respect to an upper portion of lid 106. Print segments 450 may be any material previously described for the additive process, and further, may be applied using any means previously described for adding a material to a surface. Also, the inspection system is configured to detect any uneven portions and signal to a print head to add material in a desired manner (e.g., adding print segments 450 to place indicium 108 within a tolerance 198). Also, the inspection system and the printing machine previously described can be configured add material that accounts for a thickness of an adhesive layer. In other words, print segments 450 can be added such that indicium 108 is ultimately flush with lid 106, or alternatively, within tolerance 198, even when the adhesive layer (not shown) is positioned between offset portion 412 and indicium 108. Further, in some cases, lid 106 undergoes an anodization process prior to applying indicium 108. However, both the inspection system and the printing machine are configured to apply print segments 450 to account for any additional tolerance created by an anodized layer coupled with indicium 108 and the adhesive layer. It will be appreciated that print segments 450 shown in FIG. 19 may form concentric rings around offset portion 412.

Figure 20:
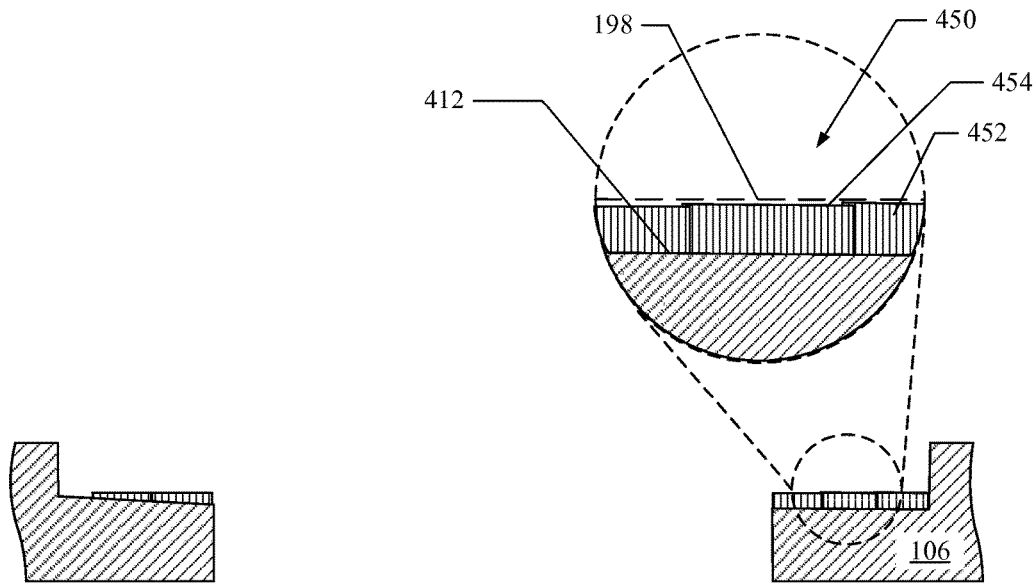
FIG. 20 illustrates a cross sectional view of the lid in FIG. 17, with a material forming several print segments, some of which overlap.

In addition to creating a level surface on offset portion 412, it is also important to address issues with light leakage within offset portion 162. While FIG. 19 shows the print segments adjacent to each other, FIG. 20 illustrates offset portion 412 having several print segments 450 overlapping one another. For example, the enlarged view in FIG. 20 shows print segments with first print segment 452 overlapping second print segment 454. This may further prevent light leakage near the interface region offset portion 162 and the indicium once the indicium is installed. Although some unevenness may occur as a result of the overlapping, print segments 450 are nonetheless configured to prevent light leakage while also allowing uniform light across indicium 108. Further, the overlapping process is still ultimately within predetermined tolerance 198. This overlapping process may be applied to any additive process previously described.

Referring again to FIG. 17, the additive process for printing material onto offset portion 412 can include printing multiple, concentric rings around offset portion 412 beginning from an inner region 414 and extending to an outer region 416. It should be noted that a removal process previously described may be performed on third surface 410 in order to create an even, or level, offset portion 412.

Figure 21:
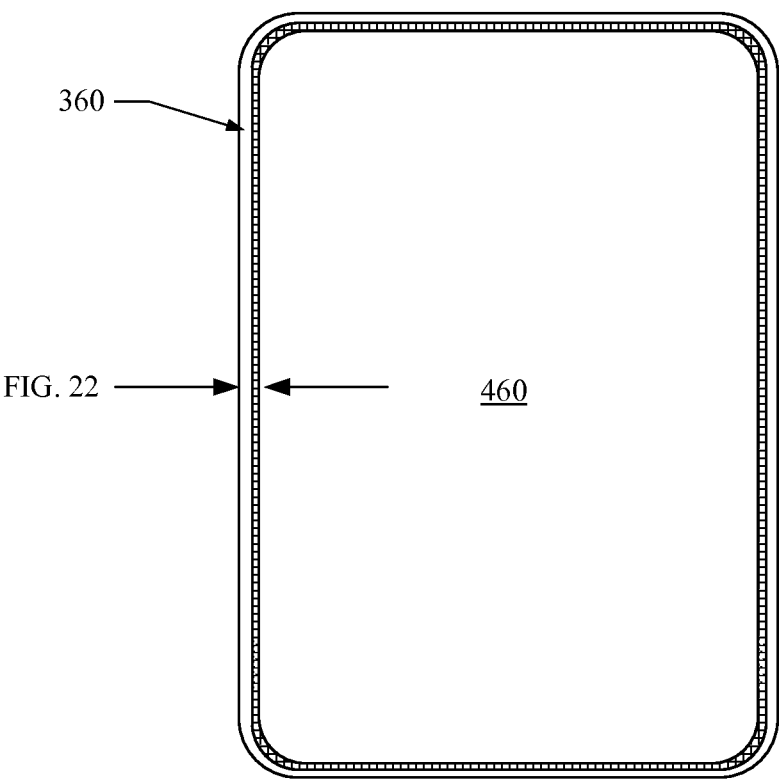
FIG. 21 illustrates a top view of a part of an electronic device having a material formed on two different sides, the two side approximately perpendicular to each other.
Figure 22:
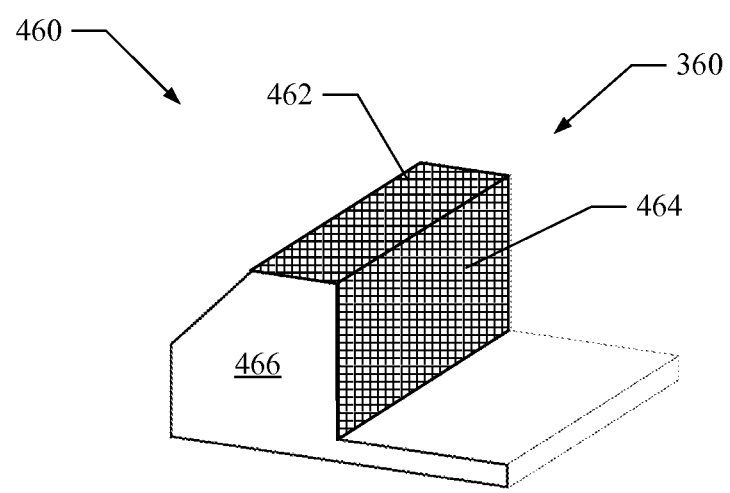
FIG. 22 illustrates an enlarged isometric view of a portion shown in FIG. 21.

While previous embodiments illustrate the additive process generally applied to a single surface, the additive process may also be applied to two surfaces generally perpendicular to each other. This may be useful in instances where unevenness, as detected by the inspection system, is found on more than one surface. FIGS. 21 and 22 illustrate material 360 applied (e.g., printed) to a part 460 having a horizontal surface and a vertical surface. Part 460 may be, for example, a lid or a bottom case of an electronic device. FIG. 22 shows an enlarged view of a portion of part 460 showing material 360 on horizontal portion 462 and vertical portion 464. Horizontal portion 462 and vertical portion 464 may define a lip portion 466 which extends around an outer peripheral portion of part 460. In some embodiments, material 360 is first applied to either horizontal portion 462 or vertical portion 464, followed by applying material 360 to the remaining portion. In other embodiments, the print head (not shown) is configured to apply material 360 simultaneously to both horizontal portion 462 and vertical portion 464. This may lead to decreased manufacturing times.

Similar to the removal process, the additive process can also undergo a second inspection in order to ensure the material applied to the part during additive process achieves is done so in a desired manner. For example, if the part receives a "fail," the inspection system can further signal the print, or add, additional material.

Also, using the additive process on a part may require less time and attention to machining the part. For example, if the part is machined in a coarse manner slightly out of the predetermined tolerance, a tightly controlled additive process may be performed to place the part within the predetermined tolerances. In this regard, less time spent machining the part coupled with applying a tightly control additive process may reduce manufacturing times and costs related to the part.

Also, while the removal process and the additive process are discussed separately, in some embodiments, the inspection system is configured to send a first adjustment signal to a removal tool to remove a portion of a surface, and also send a second adjustment signal to an additive tool to add material to the surface. Alternatively, the first adjustment signal may be associated with the additive tool, followed by the second adjustment signal associated with the removal tool. In this manner, the surface is capable of receive the desired localized corrective feature in order to place the surface within a specified tolerance.

Figure 23:
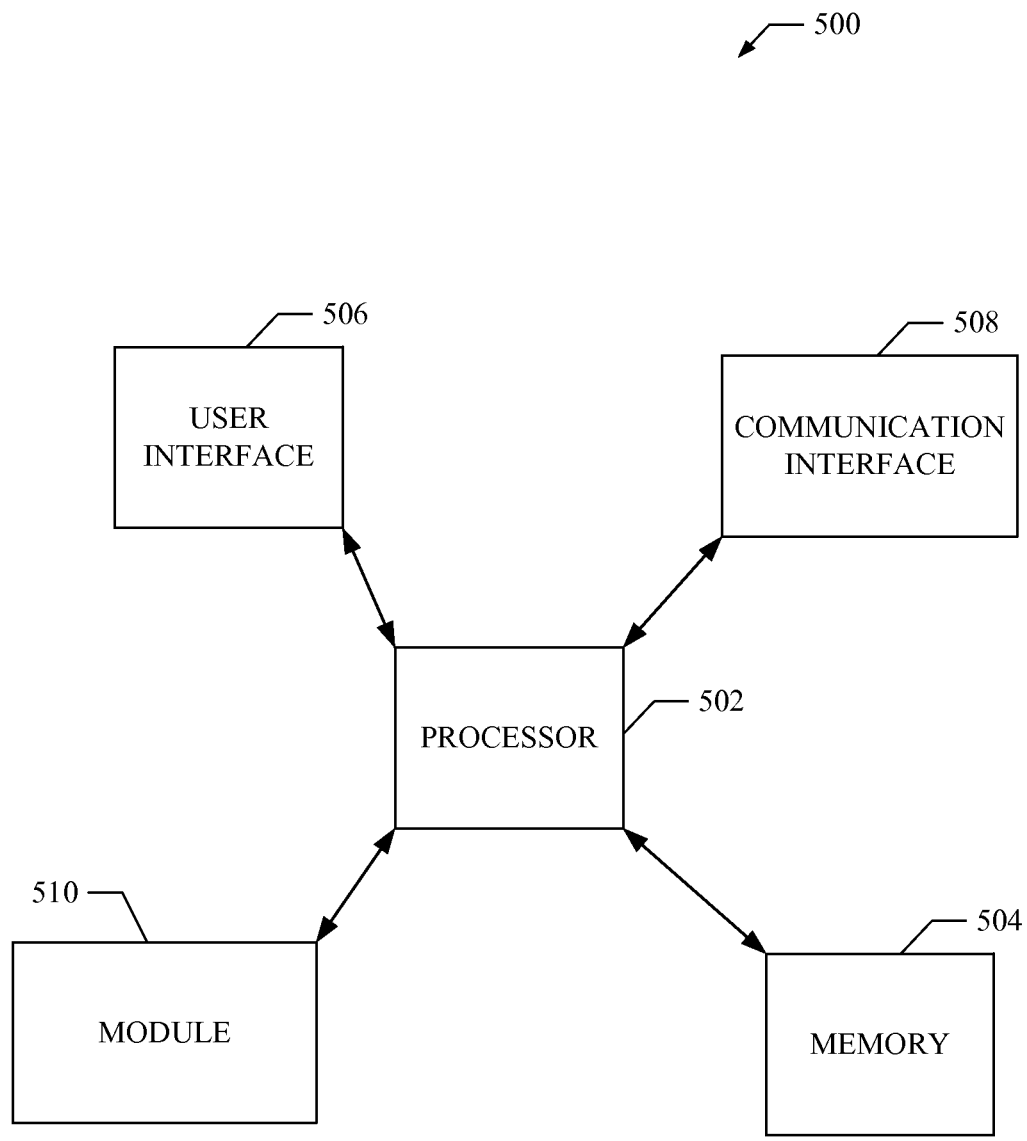
FIG. 23 illustrates a block diagram of an electronic device.

FIG. 23 is a block diagram of an electronic device 500 suitable for use with the described embodiments. In one example embodiment, the electronic device 500 may be embodied in or as a controller configured for controlling removing and/or additive processes as disclosed herein. In this regard, the electronic device 500 may be configured to control or execute the above-described removing and/or additive processes employing, for example, inspection system 201, removal tool 220, and/or print head 340.

The electronic device 500 illustrates circuitry of a representative computing device. The electronic device 500 may include a processor 502 that may be microprocessor or controller for controlling the overall operation of the electronic device 500. In one embodiments, the processor 502 may be particularly configured to perform the functions described herein relating to removing a portion of a surface with a removal tool. In another embodiment, the processor 502 may be particularly configured to perform the functions described herein relating to adding a material to a surface previously described. In yet other embodiments, the processor 502 may be particularly configured to perform the functions described herein relating to removing and adding a material to a surface previously described. The electronic device 500 may also include a memory device 504. The memory device 504 is a non-transitory computer readable medium that may be, for example, volatile and/or non-volatile memory. The memory device 504 may be configured to store computer code, information, data, files, applications, instructions or the like. For example, the memory device 504 could be configured to buffer input data for processing by the processor 502. Additionally or alternatively, the memory device 504 may be configured to store instructions for execution by the processor 502.

The electronic device 500 may also include a user interface 506 that allows a user of the electronic device 500 to interact with the electronic device. For example, the user interface 506 can take a variety of forms, such as a button, keypad, dial, touch screen, audio input interface, vision/image capture input interface, input in the form of sensor data, etc. Still further, the user interface 506 may be configured to output information to the user through a display, speaker, or other output device. A communication interface 508 may provide for transmitting and receiving data through, for example, a wired or wireless network such as a local area network (LAN), a metropolitan area network (MAN), and/or a wide area network (WAN), for example, the Internet.

The electronic device 500 may also include a module 510. The processor 502 may be embodied as, include or otherwise control the module 510. The molding module 510 may be configured for controlling or executing the inspection, removal, and/or additive operations as discussed herein.

In this regard, for example, in one embodiment a computer program product comprising at least one computer-readable storage medium having computer-executable program code portions stored therein is provided. The computer-executable program code portions, which may be stored in the memory device 504, may include program code (or computer code) instructions for performing the molding operations disclosed herein, including one or more of the operations described above in reference, for example to FIG. 14, and may be executed via a processor such as the processor 502.

Figure 24:
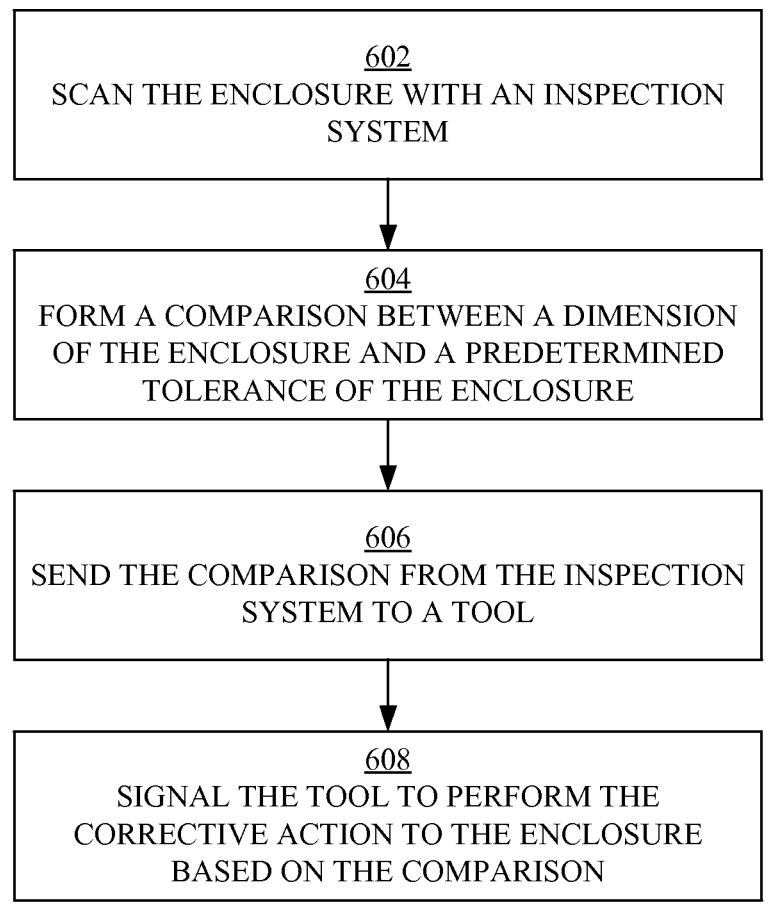
FIG. 24 illustrates a flowchart showing a method for providing a corrective action to an enclosure of an electronic device.

FIG. 24 illustrates a flowchart 600 showing a method for providing a corrective action to an enclosure of an electronic device, in accordance with the described embodiments. In step 602, the enclosure is scanned with an inspection system. The inspection system may include an automated optical system previously described. In step 604 a comparison between a dimension of the enclosure and a predetermined tolerance of the enclosure is formed. In some embodiments, the dimension is a first surface configured to receive a display. In other embodiments, the dimension is a second surface configured to receive a hinge assembly. Still, in other embodiments, the dimension is a third surface configured to receive an indicium. Also, the predetermined tolerance includes a surface or surfaces within a specification limit of the electronic device. The specification limit may be certain limits specified by the manufacturer. For example, the specification limit for the first surface includes an imaginary surface having a protrusion or protrusions with a height less than 15 microns. In this regard, the adhesive layer applied to the first surface may flow over the protrusion or protrusions.

In step 606, the comparison between the dimension and the target is sent from the inspection system to the tool. Sending the comparison may include communication to the tool such that the tool may provide the corrective action as determined by the inspection system. In some embodiments, the tool is a removal tool (e.g., laser) configured to remove a protrusion from the first surface. In some embodiments, the tool is a print head of a printing machine configured to add a material to the second surface. In step 608, the tool is signaled to perform the corrective action to the dimension based on the comparison. In some embodiments, the corrective action includes removing a protrusion from a surface. In some embodiments, the corrective action includes removing a portion of an uneven, or non-level, surface in order to make the surface even, or level. In some embodiments, the corrective action includes adding material (e.g., resin) to a surface in order build up the surface, thereby causing the surface combined with the resin to include an even, or level, surface.

Figure 25:
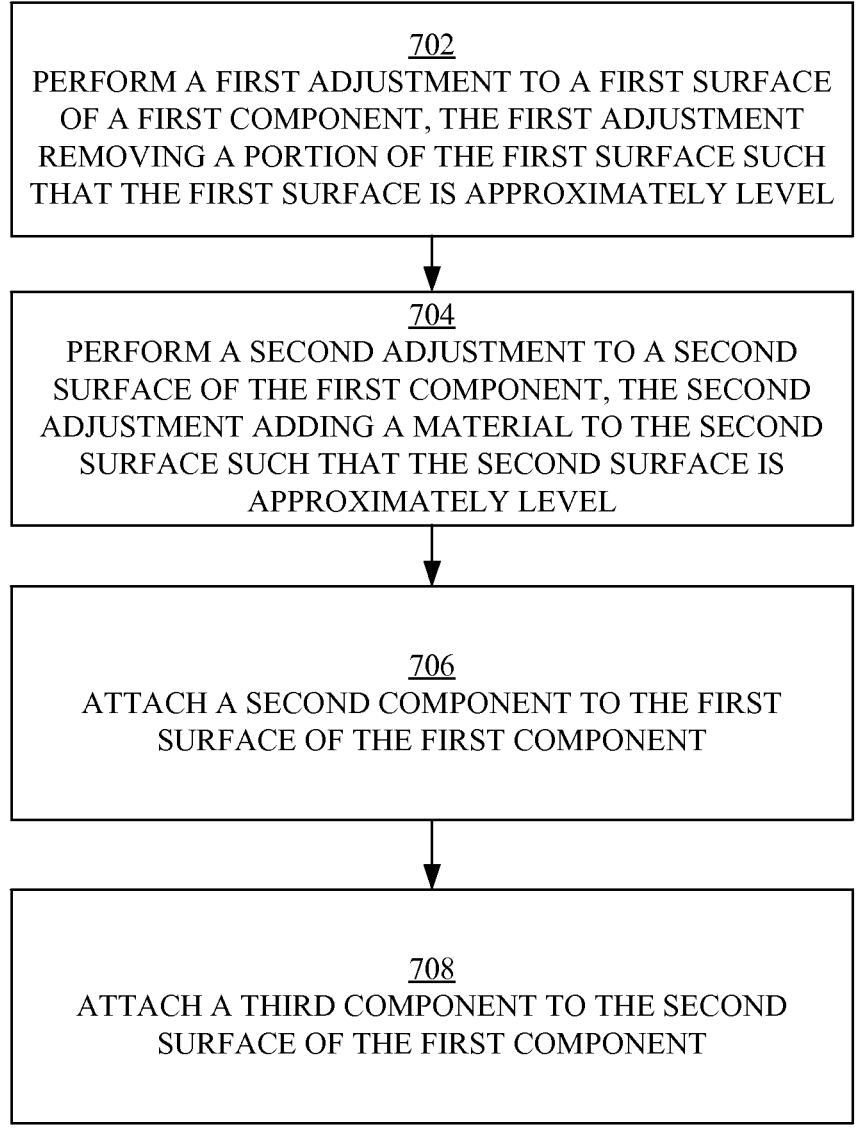
FIG. 25 illustrates a flow chart showing a method for assembling an electronic device, in accordance with the described embodiments.

FIG. 25 illustrates a flowchart 700 showing a method for assembling an electronic device, in accordance with the described embodiments. In step 702, a first adjustment is performed to a first surface of a first component, the first adjustment removing a portion of the first surface such that the first surface is approximately level. In some embodiments, the first adjustment includes using a laser to laser ablate a protrusion on the first surface. In step 704, a second adjustment is performed to a second surface of the first component, the second adjustment adding a material to the second surface such that the second surface is approximately level. In some embodiments, a print head of a printing machine emits a material (e.g., resin) onto the second surface in order to make the second surface approximately level. In step 706, a second component is attached to the first surface of the first component. In step 708, a third component to the second surface of the first component. Attachment means may include an adhesive (e.g., pressure sensitive adhesive, heat-activated adhesive, epoxy, glue, etc.). Also, an automated inspection machine (e.g., AOI) may be used to locate the first adjustment and the second adjustment.

Although the described embodiments cover inspection, removal, and additive steps to a lid of an electronic device, other parts of the electronic device could be inspected and corrected in a similar manner. For example, a top case 120 (shown in FIG. 2) could also undergo, for example, a removal process in order for mating surfaces (not shown) to conform to a predetermined tolerance.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable storage medium for controlling manufacturing operations or as computer readable code on a computer readable storage medium for controlling a manufacturing line. The computer readable storage medium is any data storage device that can store data which can thereafter be read by a computer system. Examples of the computer readable storage medium include read-only memory, random-access memory, CD-ROMs, HDDs, DVDs, magnetic tape, and optical data storage devices. The computer readable storage medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A method for assembling a housing of an electronic device, the electronic device having a first component that includes a mating surface having a first surface portion and a second surface portion separated by a recess having a dimension within an acceptable tolerance range, the method comprising:

measuring, relative to an internal reference datum, a first height of the first surface portion;

measuring, relative to the internal reference datum, a second height of the second surface portion;

when the second height is greater than the first height:

adding a printed material to the first surface portion to form a planarized mating surface such that (i) the first height is within a predetermined tolerance value of the second height, and (ii) the dimension of the recess remains generally unchanged;

placing an adhesive layer on the planarized mating surface; and attaching a second component to the first component via the adhesive layer.

2. The method as recited in claim 1, wherein, prior to adding the printed material to the first surface portion, a difference between the first and second heights exceeds the predetermined tolerance value.

3. The method as recited in claim 1, wherein, subsequent to adding the printed material to the first surface portion, the first height is generally coplanar with the second height.

4. The method as recited in claim 1, wherein the printed material is comprised of at least one of elastomeric resin.

5. The method as recited in claim 1, wherein the printed material is added to the first surface portion in a controlled manner.

6. The method as recited in claim 5, wherein a geometry of the printed material is based on the first surface portion.

7. The method as recited in claim 1, wherein a geometry of the printed material is further based on a surface profile of a corresponding mating surface of the second component.

8. The method as recited in claim 1, wherein the recess corresponds to the internal reference datum, and the recess has a height that is less than the first and second heights.

9. The method as recited in claim 8, wherein an automated inspection system utilizes the internal reference datum to determine that the second height is greater than the first height.

10. The method as recited in claim 1, wherein the second surface portion receives a hinge assembly that pivotally connects to the housing.

11. The method as recited in claim 9, wherein the internal reference datum is characterized as having a height that is lower than the first and second heights.

12. A non-transitory computer-readable storage medium containing instructions that, when executed by one or more processors of a corrective system, cause the corrective system to assemble a housing for a portable electronic device that includes a mating surface that is defined by (i) a first component having a first surface portion, and (ii) a second component having a second surface portion:

measure, relative to an internal reference datum, a first height of the first surface portion;

measure, relative to the internal reference datum, a second height of the second surface portion;

in response to determining that the second height is greater than the first height, wherein the first and second surface portions are separated by a recess having a dimension within an acceptable tolerance range:

add a printed material to the first surface portion to form a planarized mating surface such that (i) the first height is within a predetermined tolerance value of the second height, and (ii) the dimension of the recess remains generally unchanged;

apply an adhesive layer on the planarized mating surface; and attach the second component to the first component using the adhesive layer.

13. The non-transitory computer-readable storage medium of claim 12, wherein, prior to adding the printed material to the first surface portion, a difference between the first and second heights exceeds the predetermined tolerance value.

14. The non-transitory computer-readable storage medium of claim 13, wherein, subsequent to adding the printed material to the first surface portion, the first height is generally coplanar with the second height.

15. The non-transitory computer-readable storage medium of claim 12, wherein the recess corresponds to the internal reference datum, and the recess has a height that is less than the first and second heights.

16. The non-transitory computer-readable storage medium of claim 15, wherein a geometry of the printed material is based on the first surface portion and a surface profile of a corresponding mating surface of the second component.

17. A system for providing corrective adjustment for a component of a housing for an electronic device, the component including (i) a first surface portion having a first height, and (ii) a second surface portion having a second height, the system comprising:

an inspection system for determining that the component includes an uneven mating surface, wherein the second height is greater than the first height, and the first and second surface portions are separated by a recess having a dimension within an acceptable tolerance range; and a corrective system in communication with the inspection system, the corrective system configured to:

add a printed material to the first surface portion to form a planarized mating surface while preventing the recess from receiving the printed material such that the first height is within a predetermined tolerance value of the second height, place an adhesive layer on the planarized mating surface, and attach an additional component to the component via the adhesive layer.

18. The system of claim 17, wherein a geometry of the printed material is based on the first surface portion.

19. The system of claim 17, wherein the recess corresponds to an internal reference datum, and the first and second heights are measured relative to the internal reference datum.

20. The system of claim 17, wherein, prior to adding the printed material to the first surface portion, a difference in respective dimensions between the first and second heights exceeds the predetermined tolerance value.

* * * * *